US012772530B2

(12) United States Patent
Song et al.

(10) Patent No.: US 12,772,530 B2
(45) Date of Patent: Oct. 20, 2026

(54) SEMICONDUCTOR DEVICES INCLUDING VERTICAL COMMON SOURCE LINE AND DATA STORAGE SYSTEMS INCLUDING THE SAME

(71) Applicant: SAMSUNG ELECTRONICS CO., LTD., Suwon-si (KR)

(72) Inventors: Hyeonjoo Song, Suwon-si (KR); Byoungtaek Kim, Seongnam-si (KR); Haemin Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 677 days.

(21) Appl. No.: 17/530,651

(22) Filed: Nov. 19, 2021

(65) Prior Publication Data

US 2022/0310801 A1 Sep. 29, 2022

(30) Foreign Application Priority Data

Mar. 23, 2021 (KR) ........................ 10-2021-0036987

(51) Int. Cl.
*H10W 20/20* (2026.01)
*H10B 43/27* (2023.01)
*H10D 64/00* (2025.01)

(52) U.S. Cl.
CPC ........... *H10D 64/111* (2025.01); *H10B 43/27* (2023.02); *H10W 20/20* (2026.01)

(58) Field of Classification Search
CPC ........ H10B 43/27; H10B 43/10; H10B 41/27; H10B 41/35; H10B 43/20; H10B 41/20;
(Continued)

(56) References Cited

U.S. PATENT DOCUMENTS 10,128,257 B2 11/2018 Pang et al.
10,522,560 B2 12/2019 Lee
(Continued)

FOREIGN PATENT DOCUMENTS

CN 111724828 A 9/2020
CN 112185978 A 1/2021
(Continued)

*Primary Examiner* — David Chen
(74) *Attorney, Agent, or Firm* — Muir Patent Law, PLLC

(57) ABSTRACT

A semiconductor device includes a substrate, gate electrodes stacked in a first direction, channel structures penetrating through the gate electrodes, a horizontal conductive layer below the gate electrodes on the substrate, separation regions penetrating through the gate electrodes and the horizontal conductive layer, and extending in the first and second directions, a cell region insulating layer covering the gate electrodes, and an upper support layer on the separation regions and the cell region insulating layer and having openings to overlap the separation regions. Each of the separation regions includes a contact conductive layer and a first separation insulating layer in a trench, and has first regions below the openings and second regions alternating with the first regions. The contact conductive layer is in contact with the substrate in the first regions, and is spaced apart from the substrate by the first separation insulating layer in the second regions.

20 Claims, 29 Drawing Sheets

(58) Field of Classification Search
CPC ........ H10B 63/84; H10B 41/10; H10B 43/30; H10B 51/20; H10B 41/23; H10B 43/23; H10B 41/41; H10B 43/35; H01L 23/5226; H01L 25/0657; H01L 23/481; H01L 29/402; H10D 64/111
USPC .......................... 257/314, 326, 774; 438/268
See application file for complete search history.

(56) References Cited

U.S. PATENT DOCUMENTS

| | | | | |
|---|---|---|---|---|
| 10,522,562 | B2 | 12/2019 | Kim et al. | |
| 10,553,602 | B2 | 2/2020 | Lee | |
| 10,811,421 | B2 | 10/2020 | Park et al. | |
| 11,342,342 | B2 * | 5/2022 | Lee | H01L 23/5226 |
| 2015/0236038 | A1 | 8/2015 | Pachamuthu et al. | |
| 2015/0263024 | A1 | 9/2015 | Hishida et al. | |
| 2017/0104000 | A1 * | 4/2017 | Park | H10B 43/27 |
| 2017/0207232 | A1 | 7/2017 | You et al. | |
| 2018/0026041 | A1 * | 1/2018 | Park | H01L 23/3185 257/334 |
| 2018/0130814 | A1 * | 5/2018 | Lee | H10B 43/27 |
| 2019/0333931 | A1 * | 10/2019 | Jung | H10B 41/41 |
| 2020/0098782 | A1 * | 3/2020 | Nojima | H10B 43/27 |
| 2020/0203366 | A1 | 6/2020 | Kim et al. | |
| 2020/0203370 | A1 | 6/2020 | Son et al. | |
| 2020/0350326 | A1 | 11/2020 | Yun et al. | |

FOREIGN PATENT DOCUMENTS

| | | | |
|---|---|---|---|
| KR | 10-2015-0126524 | A | 11/2015 |
| KR | 10-2016-0087691 | A | 7/2016 |
| KR | 1020180051183 | A | 5/2018 |
| KR | 1020190125811 | A | 11/2019 |

* cited by examiner

SEMICONDUCTOR DEVICES INCLUDING VERTICAL COMMON SOURCE LINE AND DATA STORAGE SYSTEMS INCLUDING THE SAME

CROSS-REFERENCE TO RELATED APPLICATION

This application claims benefit of priority to Korean Patent Application No. 10-2021-0036987 filed on Mar. 23, 2021, in the Korean Intellectual Property Office, the disclosure of which is incorporated herein by reference in its entirety.

BACKGROUND

1. Field

The present disclosure relates to semiconductor devices and data storage systems including the same.

2. Description of the Related Art

In a data storage system requiring data storage, there is increasing demand for a semiconductor device which may store high-capacity data. Accordingly, research into methods of increasing data storage capacity of a semiconductor device has been conducted. For example, a semiconductor device including three-dimensionally arranged memory cells, rather than two-dimensionally arranged memory cells, has been proposed as a method of increasing data storage capacity of a semiconductor device.

SUMMARY

According to an example embodiment, a semiconductor memory device may include a substrate, gate electrodes stacked to be spaced apart from each other in a first direction, perpendicular to an upper surface of the substrate, channel structures penetrating through the gate electrodes, extending in the first direction, and respectively including a channel layer, a horizontal conductive layer disposed below the gate electrodes on the substrate to be in contact with the channel layer of each of the channel structures, separation regions penetrating through the gate electrodes and the horizontal conductive layer, extending in the first direction and a second direction perpendicular to the first direction, and disposed to be spaced apart from each other in a third direction, perpendicular to the first direction and the second direction, a cell region insulating layer covering the gate electrodes and the channel structures, and an upper support layer disposed on the separation regions and the cell region insulating layer and having openings disposed to overlap the separation regions on a portion of the separation regions. Each of the separation regions includes a contact conductive layer and a first separation insulating layer disposed in a trench, and has first regions disposed below the openings and second regions disposed alternately with the first regions. The contact conductive layer is in contact with the substrate in the first regions, and is spaced apart from the substrate by the first separation insulating layer in the second regions.

According to another example embodiment, a semiconductor device may include a substrate, gate electrodes stacked to be spaced apart from each other in a first direction, perpendicular to an upper surface of the substrate, channel structures penetrating through the gate electrodes, extending in the first direction, and respectively including a channel layer, separation regions penetrating through the gate electrodes between the channel structures, extending in the first direction and a second direction perpendicular to the first direction, and each including a contact conductive layer and a separation insulating layer, and pad layers respectively disposed to be connected to an upper end of the contact conductive layer and having upper surfaces on a higher level than upper surfaces of the channel structures. The separation regions have first regions and second regions alternately disposed in the second direction. The contact conductive layer is in contact with the substrate in the first regions, and is spaced apart from the substrate by the separation insulating layer in the second regions.

According to yet another example embodiment, a data storage system may include a semiconductor storage device including a substrate, circuit elements disposed on one side of the substrate, gate electrodes stacked to be spaced apart from each other in a first direction, perpendicular to an upper surface of the substrate, channel structures penetrating through the gate electrodes, extending in the first direction, and respectively including a channel layer, separation regions penetrating through the gate electrodes, extending in the first direction and a second direction perpendicular to the first direction, and disposed to be spaced apart from each other in a third direction, perpendicular to the first direction and the second direction, a cell region insulating layer covering the gate electrodes and the channel structures, an upper support layer disposed on the separation regions and the cell region insulating layer and having openings disposed to overlap the separation regions on a portion of the separation regions, and an input/output pad electrically connected to the circuit elements, and a controller electrically connected to the semiconductor storage device through the input/output pad and configured to control the semiconductor storage device. Each of the separation regions includes a contact conductive layer and a separation insulating layer disposed in a trench, and has first regions, overlapping the openings to be disposed below the openings, and second regions disposed alternately with the first regions. The contact conductive layer is in contact with the substrate in the first regions, and is spaced apart from the substrate by the separation insulating layer in the second regions.

BRIEF DESCRIPTION OF DRAWINGS

Features will become apparent to those of skill in the art by describing in detail exemplary embodiments with reference to the attached drawings, in which.

DETAILED DESCRIPTION

Figure 1A:
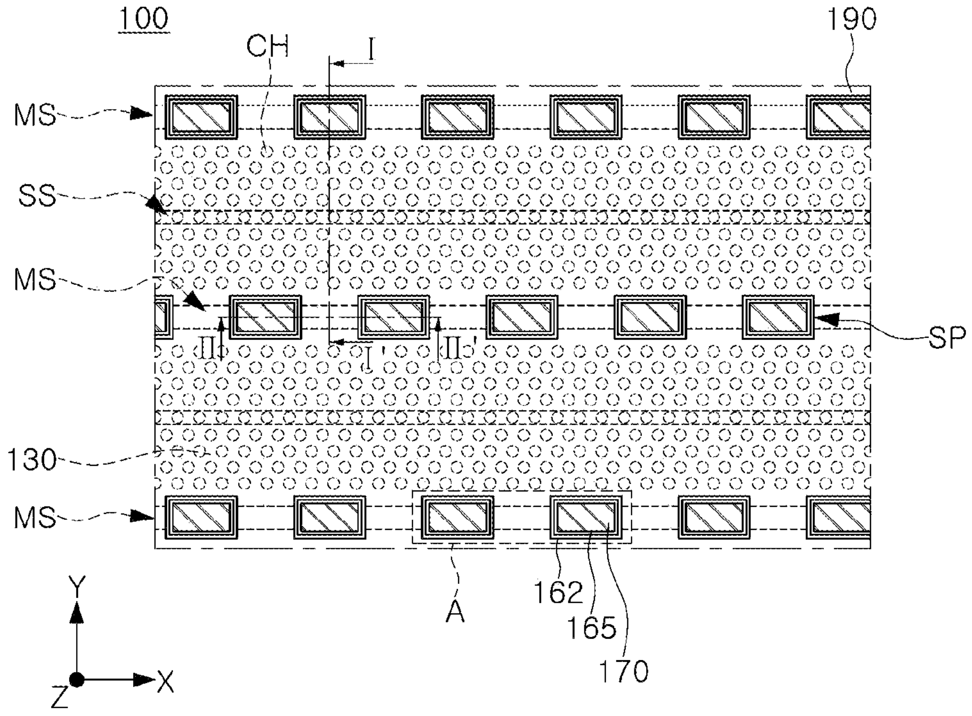
FIGS. 1A and 1B are schematic plan views of a semiconductor device according to example embodiments.
Figure 1B:
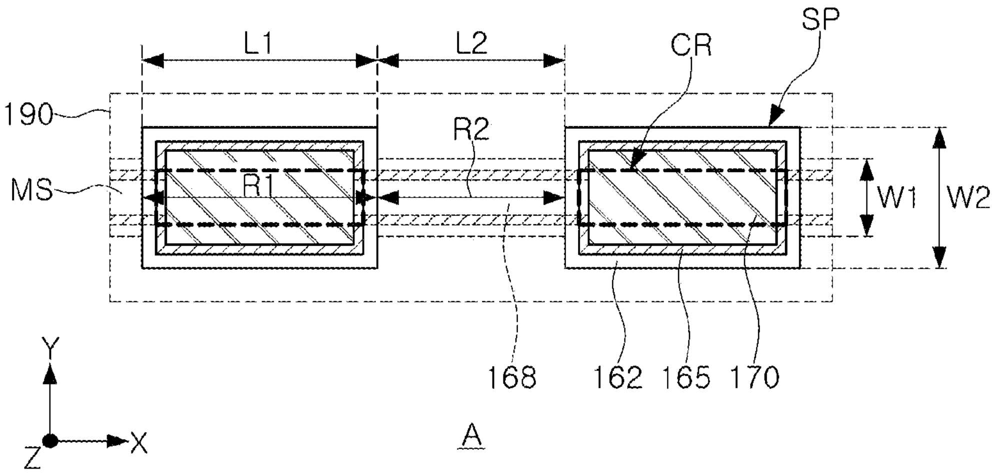
Figure 2A:
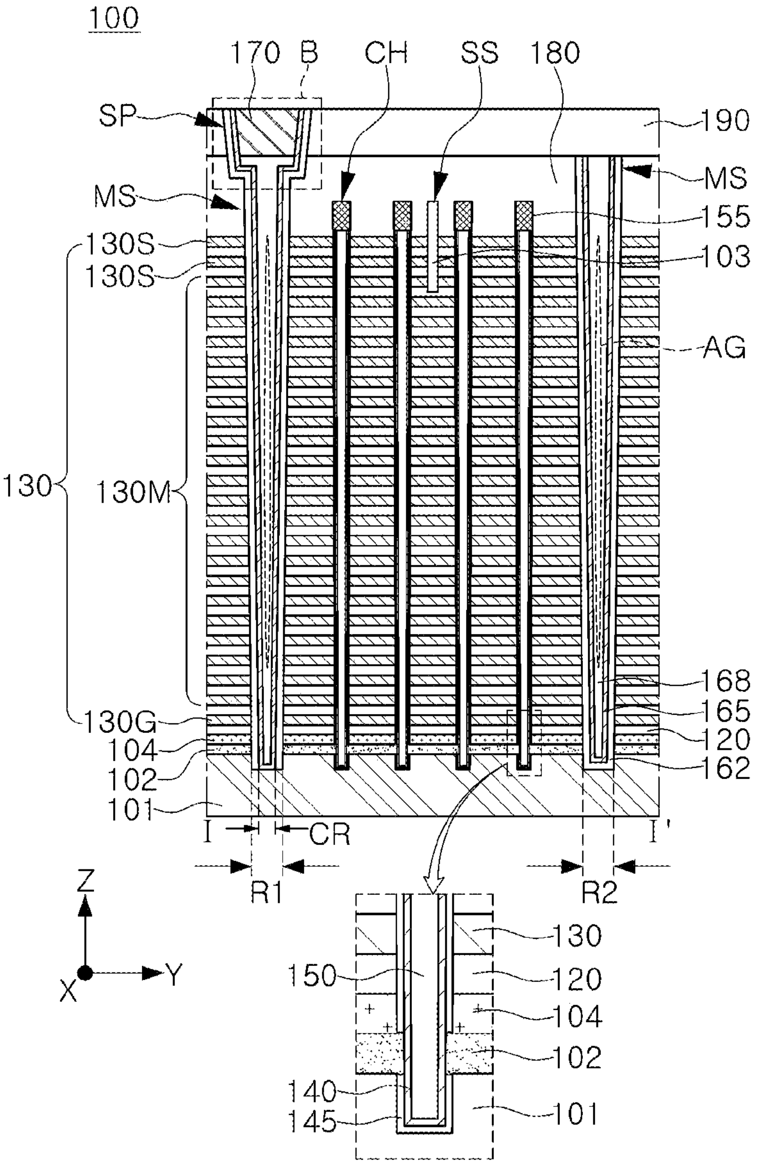
FIGS. 2A and 2B are schematic cross-sectional views of a semiconductor device according to example embodiments.
Figure 2B:
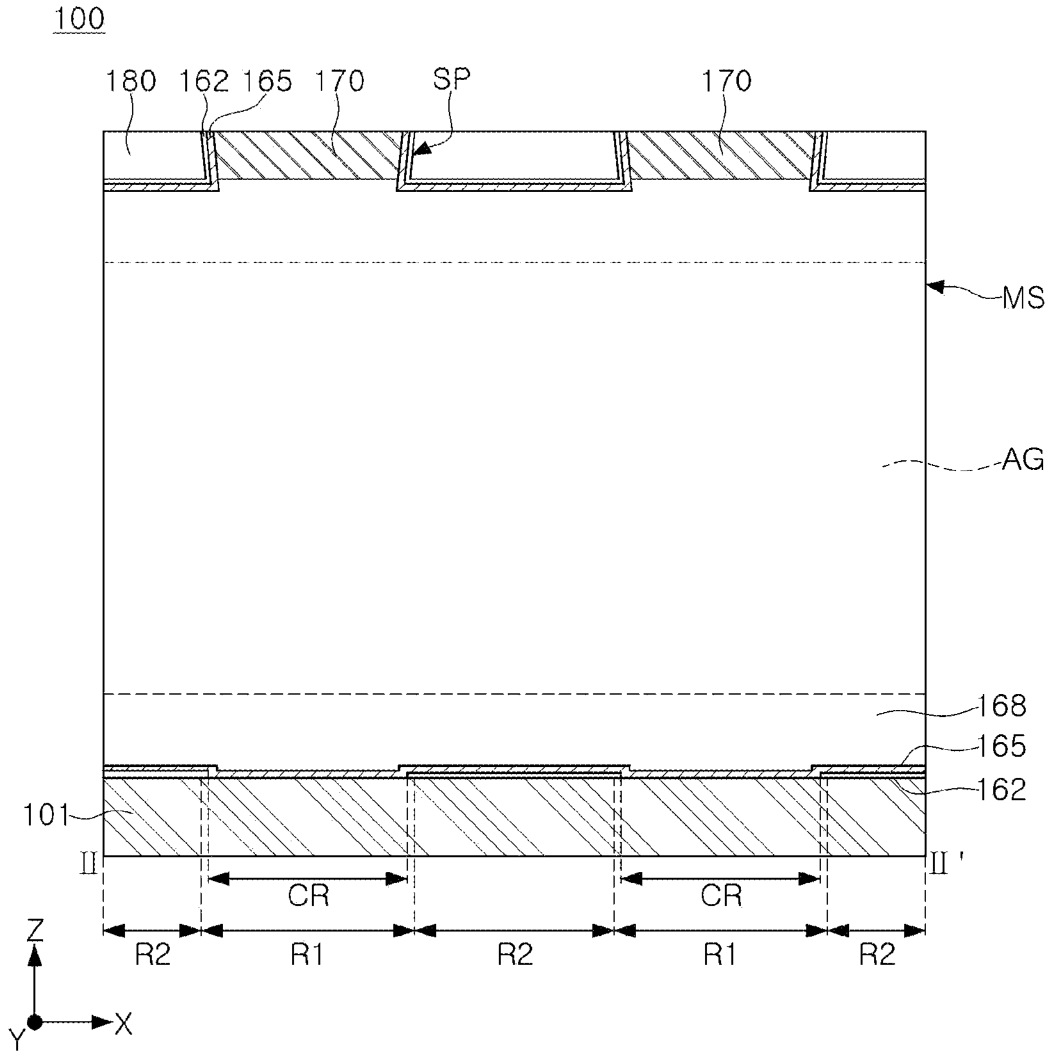
Figure 3:
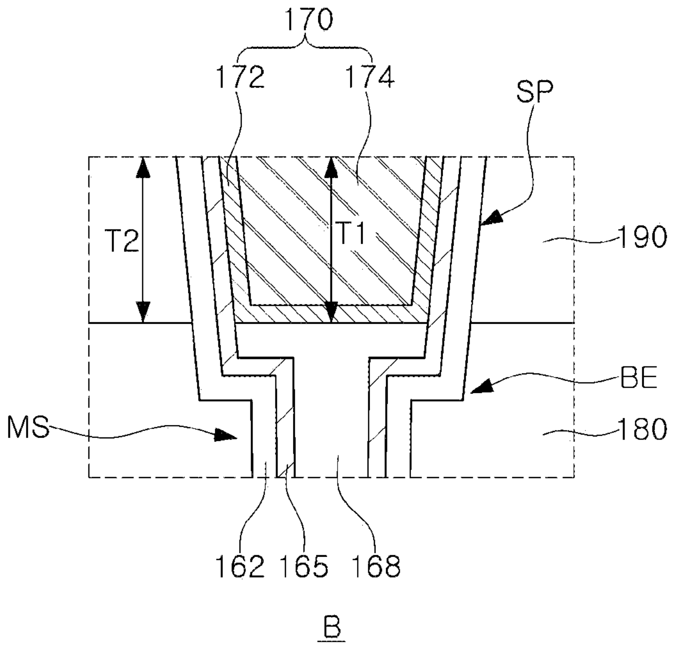
FIG. 3 is a partially enlarged view of a semiconductor device according to example embodiments.

FIGS. 1A and 1B are schematic plan views of a semiconductor device according to example embodiments, with FIG. 1B being an enlarged view of region "A" of FIG. 1A. FIGS. 2A and 2B are cross-sectional views taken along lines I-I' and II-II' of FIG. 1A, respectively, and FIG. 3 is an enlarged view of region "B" of FIG. 2A.

Referring to FIGS. 1A to 3, a semiconductor device 100 may include a substrate 101, a first horizontal conductive layer 102 and a second horizontal conductive layer 104 on the substrate 101, gate electrodes 130 stacked on the substrate 101, interlayer insulating layers 120 stacked on the substrate 101 alternately with the gate electrodes 130, channel structures CH disposed to penetrate through a stack structure of the gate electrodes 130 and respectively including a channel layer 140, upper separation regions SS penetrating through, e.g., only, a portion of the stack structure, separation regions MS extending while penetrating through the, e.g., entire, stack structure, pad layers 170 on a portion of the separation regions MS, a cell region insulating layer 180 covering the gate electrodes 130 and the channel structures CH, and an upper support layer 190 disposed on the separation regions MS and the cell region insulating layer 180.

In the semiconductor device 100, a single memory cell string may be configured around each of the channel structure CH, and a plurality of memory cell strings may be arranged in columns and rows in an X-direction and a Y-direction.

The substrate 101 may have an upper surface extending in the X-direction and the Y-direction. The substrate 101 may include a semiconductor material, e.g., a group IV semiconductor, a group III-V compound semiconductor, or a group II-VI compound semiconductor. For example, the group IV semiconductor may include silicon, germanium, or silicon-germanium. The substrate 101 may be provided as, e.g., a bulk wafer, an epitaxial layer, a silicon-on-insulator (SOI) layer, a semiconductor-on-insulator (SeOI) layer, or the like.

The first and second horizontal conductive layers 102 and 104 may be stacked to be disposed on the upper surface of the substrate 101. The first horizontal conductive layer 102 may function as at least a portion of a common source line of the semiconductor device 100, e.g., as a common source line together with the substrate 101. As illustrated in the enlarged view of FIG. 2A, the first horizontal conductive layer 102 may be directly connected to the channel layer 140 on a circumference of the channel layer 140.

The first and second horizontal conductive layers 102 and 104 may include a semiconductor material, e.g., polysilicon. In this case, at least the first horizontal conductive layer 102 may be a layer doped with impurities having the same conductivity type as the substrate 101, and the second horizontal conductive layer 104 may be a doped layer or a layer including impurities diffused from the first horizontal conductive layer 102. However, a material of the second horizontal conductive layer 104 is not limited to a semiconductor material and, according to embodiments, the second horizontal conductive layer 104 may be replaced with an insulating layer.

The gate electrodes 130 may be vertically staked on the substrate 101 and spaced apart from each other, e.g., along the Z-direction, to form a stack structure. The gate electrodes 130 may include a lower gate electrode 130G constituting a gate of a ground select transistor, memory gate electrodes 130M constituting a plurality of memory cells, and upper gate electrodes 130S constituting gates of string select transistors. The number of memory gate electrodes 130M, constituting memory cells, may be determined depending on capacity of the semiconductor device 100. According to embodiments, each of the upper and lower gate electrodes 130S and 130G may include one, two or more electrodes, and may have the same structure as the gate electrodes 130M or a structure different from that of the gate electrodes 130M. In example embodiments, the gate electrodes 130 may be disposed above the upper gate electrodes 130S and/or below the lower gate electrode 130G, and may further include a gate electrode 130 constituting an erase transistor used in an erase operation using gate-inducted drain leakage (GIDL) current. Some gate electrodes 130, e.g., the memory gate electrodes 130M adjacent to the upper or lower gate electrodes 130S and 130G, may be dummy gate electrodes.

The gate electrodes 130 may include a metal material, e.g., tungsten (W). According to embodiments, the gate electrodes 130 may include polysilicon or a metal silicide material. In example embodiments, the gate electrodes 130 may further include a diffusion barrier. For example, the diffusion barrier may include tungsten nitride (WN), tantalum nitride (TaN), titanium nitride (TiN), or combinations thereof.

The interlayer insulating layers 120 may be disposed between the gate electrodes 130. Similarly to the gate electrodes 130, the interlayer insulating layers 120 may be disposed to be spaced apart from each other in a direction perpendicular to the upper surface of the substrate 101, e.g., along the Z-direction. The interlayer insulating layers 120 may include an insulating material, e.g., silicon oxide or silicon nitride.

The channel structures CH may each constitutes a single memory cell string, and may be disposed to be spaced apart from each other while constituting rows and columns on the substrate 101. The channel structures CH may be disposed to form a grid pattern in an X-Y plane, or may be disposed in a zigzag pattern in one direction. The channel structures CH may have a columnar shape, and may have inclined side surface narrowed in a direction toward the substrate 101 depending on an aspect ratio. As illustrated in the enlarged view of FIG. 2A, each of the channel structures CH may include a gate dielectric layer 145, a channel filling insulating layer 150 between the channel layers 140, and a channel pad 155 in an upper portion, other than the channel layer 140.

For example, the channel layer 140 may be formed to have an annular shape surrounding the internal channel filling insulating layer 150. In another example, the channel layer 140 may have a columnar shape, e.g., a cylindrical shape or a prismatic shape, without the channel filling insulating layer 150. The channel layer 140 may be connected to the first horizontal conductive layer 102 below the channel layer 140. The channel layer 140 may include a semiconductor material, e.g., polycrystalline silicon or single-crystalline silicon, and the semiconductor material may be an undoped material or a material containing p-type or n-type impurities.

The gate dielectric layer 145 may be disposed between the gate electrodes 130 and the channel layer 140. Although not illustrated in detail, the gate dielectric layer 145 may include a tunneling layer, a charge storage layer, and a blocking layer that are sequentially stacked from the channel layer 140. The tunneling layer may tunnel charges to the charge storage layer and may include, e.g., silicon oxide ($SiO_2$), silicon nitride ($Si_3N_4$), silicon oxynitride (SiON), or combinations thereof. The charge storage layer may be a charge trapping layer or a floating gate conductive layer. The blocking layer may include, e.g., silicon oxide ($SiO_2$), silicon nitride ($Si_3N_4$), silicon oxynitride (SiON), a high-k dielectric material, or combinations thereof. In example embodiments, at least a portion of the gate dielectric layer 145 may extend along the gate electrodes 130 in a horizontal direction.

The channel pads 155 may be disposed on the channel layer 140 in the channel structures CH. The channel pads 155 may be disposed to cover an upper surface of the channel filling insulating layer 150 and to be electrically connected to the channel layer 140. The channel pads 155 may include, e.g., doped polysilicon.

The upper separation regions SS may extend in the X direction between the separation regions MS adjacent in the Y direction. The upper separation regions SS may be disposed to penetrate through some gate electrodes 130 including an uppermost gate electrode 130, among the gate electrodes 130. As illustrated in FIG. 2A, the upper separation regions SS may separate, e.g., a total of three gate electrodes 130 from each other in the Y direction. However, the number of gate electrodes 130 separated by the upper separation regions SS may vary according to example embodiments. The upper separation regions SS may include an upper separation insulating layer 103.

The separation regions MS may extend through the gate electrodes 130, the interlayer insulating layers 120, and the first and second horizontal conductive layers 102 and 104, e.g., both in the X-direction and in the Z-direction. The separation regions MS may at least partially extend into the substrate 101, e.g., both in the X-direction and in the Z-direction, and may be connected to the substrate 101. For example, as illustrated in FIGS. 1A and 2B, each of the separation region MS may extend continuously in the X-direction, e.g., with a plurality of pad layers 170 being spaced apart from each other along the X-direction in each of the separation region MS. As illustrated in FIG. 1A, the separation regions MS may be disposed to be parallel to each other, e.g., the separation regions MS may be spaced apart from each other in the Y-direction. Each of the separation regions MS may be disposed in a trench extending, e.g., continuously, in the X-direction and in the Z-direction. The separation regions MS may separate the gate electrodes 130 from each other in the Y direction. The separation regions MS may have a shape in which a width thereof is decreased in a direction toward the substrate 101 due to a high aspect ratio. Each of the separation regions MS may include a first separation insulating layer 162, a contact conductive layer 165, and a second separation insulating layer 168 disposed in the trench.

The separation regions MS may include first regions R1 and second regions R2 alternately disposed in the X direction. As illustrated in FIGS. 2A and 2B, the contact conductive layer 165 may be in direct contact with the substrate 101 in at least a portion of each of the first regions R1, and the contact conductive layer 165 may be spaced apart from the substrate 101 by the first separation insulating layer 162 in the second regions R2. For example, as illustrated in FIG. 2B, the contact conductive layer 165 may extend continuously along a bottom of the trench of the separation region MS to be on the substrate 101, while the first separation insulating layer 162 may be only in the second regions R2 to separate between the contact conductive layer 165 and the substrate 101 in the second region R2. The entire first regions R1 may correspond to a region overlapping openings SP of the upper support layer 190 in a plan view and disposed below the openings SP, e.g., to overlap the pad layers 170, and the second regions R2 may correspond to a region not overlapping the openings SP of the upper support layer 190.

A ratio L1/L2 of a first length L1 of the first region R1 in the X direction to a second length L2 of the second region R2 in the X direction may be in a range of about 0.8 to about 5.0, about 1.0 to about 4.0. When the ratio L1/L2 is lower than 0.8, the difficulty in process of forming the gate electrode 130 may be increased. When the ratio L1/L2 is higher than 5.0, a supporting force for the stack structure of the interlayer insulating layers 120 during a fabrication process may be reduced. For example, a ratio L1/(L1+L2) of the first length L1 to a sum of the first length L1 and the second length L2 may be in a range of about 40% to about 85%. In some embodiments, the first length L1 may be larger than or equal to the second length L2.

The first separation insulating layer 162, the contact conductive layer 165, and the second separation insulating layer 168 may be sequentially disposed in a trench of the separation regions MS. The first separation insulating layer 162 may cover internal side surfaces of the trench in the first regions R1 and may expose the substrate 101 on a bottom surface of the trench. The first separation insulating layer 162 may cover internal side surfaces and a bottom surface of the trench in the second regions R2. The first separation insulating layer 162 may extend inwardly in the openings SP of the upper support layer 190. In some embodiments, the first separation insulating layer 162 may further include regions partially extending toward the gate electrodes 130. For example, referring to FIGS. 2A and 2B, the first separation insulating layer 162 may continuously cover the entirety of the internal side surfaces of the trench in each of the separation regions MS, while covering the bottom of the trench only in the second region R2.

The contact conductive layer 165 may be disposed on the first separation insulating layer 162. The contact conductive layer 165 may function as a contact plug connected to a common source line of the semiconductor device 100. Alternatively, the contact conductive layer 165 may be construed as a portion of a common source line of the semiconductor device 100. The contact conductive layer 165 may extend from the internal side surfaces of the trench along the bottom surface of the trench, by a relatively low thickness, on the first separation insulating layer 162. The contact conductive layer 165 may cover the bottom surface of the trench exposed by the first separation insulating layer 162 in contact regions CR of the first regions R1. The contact regions CR may correspond to regions, other than a region in which the substrate 101 is in contact with the first separation insulating layer 162 in the first regions R1, as illustrated in FIGS. 1B to 2B. The contact conductive layer 165 may extend inwardly in the openings SP of the upper support layer 190 and may be in contact with the pad layer 170 through a side surface, as illustrated in FIG. 3. The contact conductive layer 165 may extend, e.g., continuously, in the X-direction such that an overall width including both ends, except for partial regions of an upper end including a bent portion BE (FIG. 3), is substantially constant. For example, referring to FIGS. 2A and 3, a width of the contact conductive layer 165 in the Y-direction, with the exception of the portion in the bent portion BE, may be substantially constant.

The second separation insulating layer 168 may be disposed on the contact conductive layer 165 to fill the trench. The second separation insulating layer 168 may have an air-gap AG therein. When the second separation insulating layer 168 is formed, an air-gap AG may be formed in the second separation insulating layer 168 due to a high aspect ratio of the separation region MS. However, in example embodiments, the second separation insulating layer 168 may be formed without the air-gap AG.

The first separation insulating layer 162 and the second separation insulating layer 168 may include an insulating material, e.g., at least one of silicon oxide, silicon nitride, and silicon oxynitride. The contact conductive layer 165 may include a conductive material, e.g., a metal. The contact conductive layer 165 may include, e.g., at least one of titanium (Ti), titanium nitride (TiN), and tungsten (W).

As illustrated in FIG. 3, the first regions R1 of the separation regions MS may have the bent portion BE having a width changing in the Y direction below the openings SP of the upper support layer 190. The separation regions MS may have a shape in which a width thereof is increased in a direction toward the pad layer 170 by the bent portion BE.

As illustrated in FIG. 2A, the cell region insulating layer 180 may be disposed to cover the gate electrodes 130 and the channel structures CH. According to example embodiment, the cell region insulating layer 180 may include a plurality of insulating layers. The cell region insulating layer 180 may be formed of an insulating material and may include at least one of, e.g., silicon oxide, silicon nitride, and silicon oxynitride.

As further illustrated in FIG. 2A, the upper support layer 190 may be disposed on the separation regions MS and the cell region insulating layer 180, and may have openings SP, e.g., the openings SP may extend through an entire thickness of the upper support layer 190 and through a portion of the cell region insulating layer 180. As illustrated in FIGS. 1A and 1B, the openings SP of the upper support layer 190 may be disposed to overlap the separation regions MS on the separation regions MS. The openings SP may be disposed at regular intervals in the X direction, a direction in which the separation regions MS extend. The openings SP may have a second width W2, e.g., in the Y-direction, greater than a first width W1 of the separation regions MS in the Y-direction. The first and second widths W1 and W2 may be widths on, e.g., measured along, upper ends of each of the openings SP and the separation regions MS, or may be average widths. The openings SP are illustrated as having a rectangular shape in a plan view. However, a shape of the openings SP is not limited thereto, e.g., may have a rounded shape, and may depend on process conditions.

The upper support layer 190 may be formed of an insulating material and may include, e.g., at least one of silicon oxide, silicon nitride, and silicon oxynitride. The upper support layer 190 may be formed of the same material as the cell region insulating layer 180. Alternatively, the upper support layer 190 may be formed of a material different from a material of the cell region insulating layer 180. However, even when the upper support layer 190 is formed of the same material as the cell region insulating layer 180, the upper support layer 190 and the cell region insulating layer 180 may be formed in different process operations, and thus, boundaries thereof may be distinguishable from each other, or boundaries thereof may be distinguishable by upper surfaces of the second regions R2 of the separation regions MS.

In the openings SP, the first separation insulating layer 162 and the contact conductive layer 165 may be disposed to extend from the separation regions MS, in particular, the first regions R1 of the separation regions MS. In the openings SP, the pad layers 170 may be further disposed to be in contact with the contact conductive layer 165.

As illustrated in FIG. 2A, the pad layers 170 may be disposed in the openings SP of the upper support layer 190. The pad layers 170 may be in contact with and connected to a portion including an upper end of the contact conductive layer 165 to be electrically connected to the substrate 101 and the first horizontal conductive layer 102 through the contact conductive layer 165. The pad layers 170 may be connected to an upper interconnection structure, e.g., a contact plug, to receive an electrical signal.

As illustrated in FIG. 1A, the pad layers 170 may be arranged to have a shape in which adjacent pad layers 170 are offset, e.g., shifted, from each other in the Y direction depending on the arrangement of the openings SP, e.g., a zigzag pattern. The pad layers 170 may be disposed to overlap at least a portion of each of the first regions R1 of the separation regions MS. The pad layers 170 may be disposed on substantially the same height level as the upper support layer 190, but example embodiments are not limited thereto. The term "substantially the same" used herein refers to the same, or a case in which there is a difference in ranges of deviation occurring in a fabrication process. Even when the word "substantially" is omitted, it may be construed as the same. Upper surfaces of the pad layers 170 may be substantially coplanar with upper surface of the upper support layer 190. For example, as illustrated in the enlarged view of FIG. 3, a first thickness T1 of the pad layer 170 may be substantially the same as a second thickness T2 of the upper support layer 190.

The pad layers 170 may include a barrier layer 172 and a pad conductive layer 174. The pad layers 170 may include a conductive material. The barrier layer 172 may include, e.g., titanium (Ti), titanium nitride (TiN), a Ti/TiN double layer, or the like, and the pad conductive layer 174 may include, e.g., tungsten (W), aluminum (Al), copper (Cu), or the like. For example, the pad layers 170 may include a single layer or a plurality of layers including three or more conductive layers.

Figure 4A:
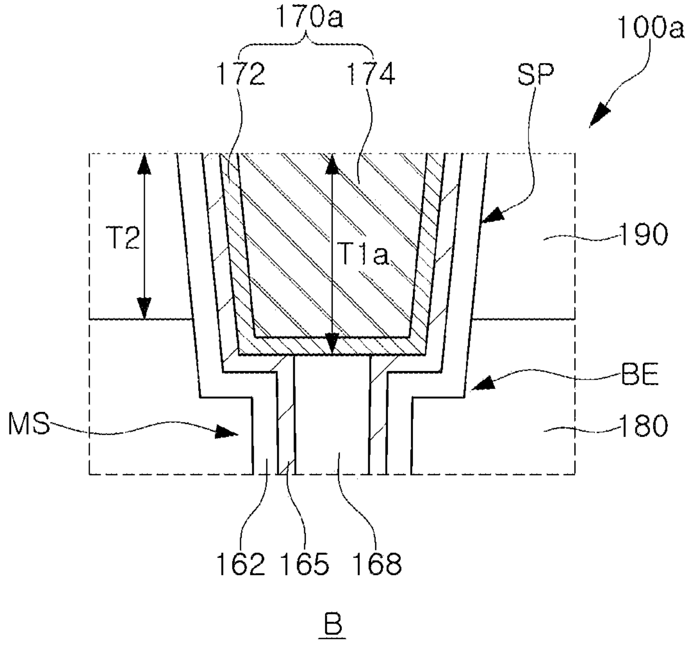
FIGS. 4A and 4B are partially enlarged views of a semiconductor device according to example embodiments.
Figure 4B:
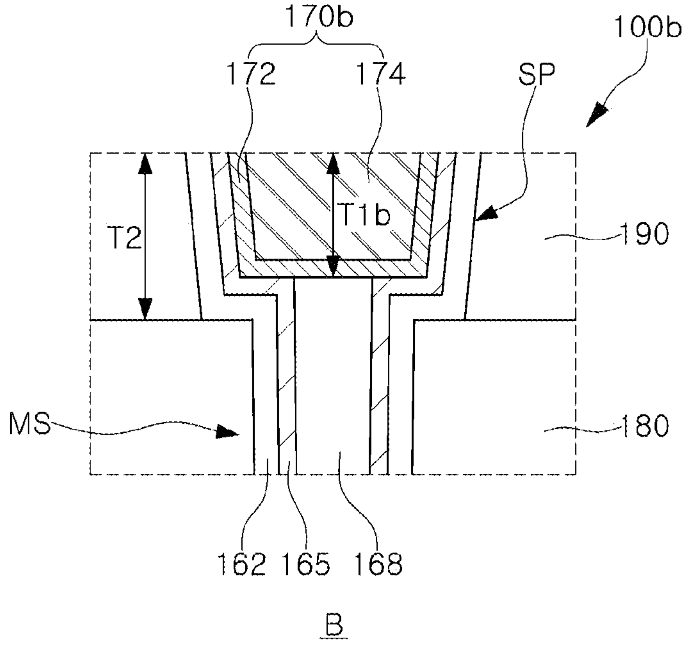

FIGS. 4A and 4B are partially enlarged views of a semiconductor device according to example embodiments. FIGS. 4A and 4B are enlarged views of a region corresponding to region "B" of FIG. 2A.

Referring to FIG. 4A, in a semiconductor device 100*a*, a first thickness T1*a* of a pad layer 170*a* may be greater than the second thickness T2 of the upper support layer 190. Accordingly, a lower surface of the pad layer 170*a* may be disposed on a lower height level than a lower surface of an upper support layer 190, e.g., relative to the substrate. A portion of the pad layer 170*a* may extend inwardly in the separation region MS. For example, as illustrated in FIG. 4A, the pad layer 170*a* may extend to the bent portion BE of the separation region MS to extend downwardly. However, a length of the pad layer 170*a*, extending inwardly in the separation region MS, may vary according to example embodiment.

Referring to FIG. 4B, in a semiconductor device 100*b*, a first thickness T1*b* of a pad layer 170*b* may be smaller than the second thickness T2 of the upper support layer 190. Accordingly, a lower surface of the pad layer 170*b* may be disposed at a higher level than a lower surface of the upper support layer 190. In addition, the separation region MS may not have a bent portion below the pad layer 170*b*, and may have a shape in which the first separation insulating layer 162 and the contact conductive layer 165 are bent at a boundary between the cell region insulating layer 180 and the upper support layer 190.

Figure 5:
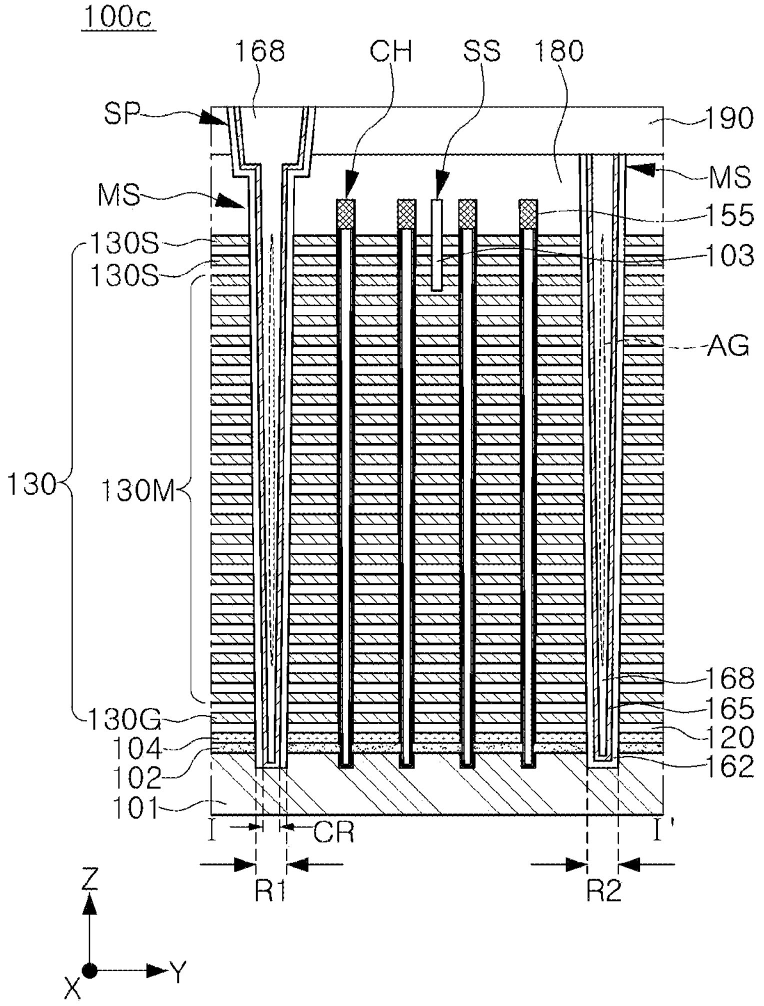
FIG. 5 is a schematic cross-sectional view of a semiconductor device according to example embodiments.

FIG. 5 is a schematic cross-sectional view of a semiconductor device according to example embodiments. The view in FIG. 5 corresponds to that in FIG. 2A.

Referring to FIG. 5, a semiconductor device 100*c* may not include the pad layer 170, unlike the example embodiment of FIGS. 1A to 3. Accordingly, the second separation insulating layer 168 of the separation region MS may further extend inwardly in the opening SP of the upper support layer 190. The opening SP may be filled with the first separation insulating layer 162, the contact conductive layer 165, and the second separation insulating layer 168 extending from the separation region MS. This may be described as the separation region MS is disposed to extends inwardly in the opening SP. In the present embodiment, the contact conductive layer 165 may be connected to an upper interconnection structure, e.g., an additional contact plug or an interconnection line, through an upper surface in some region.

Figure 6:
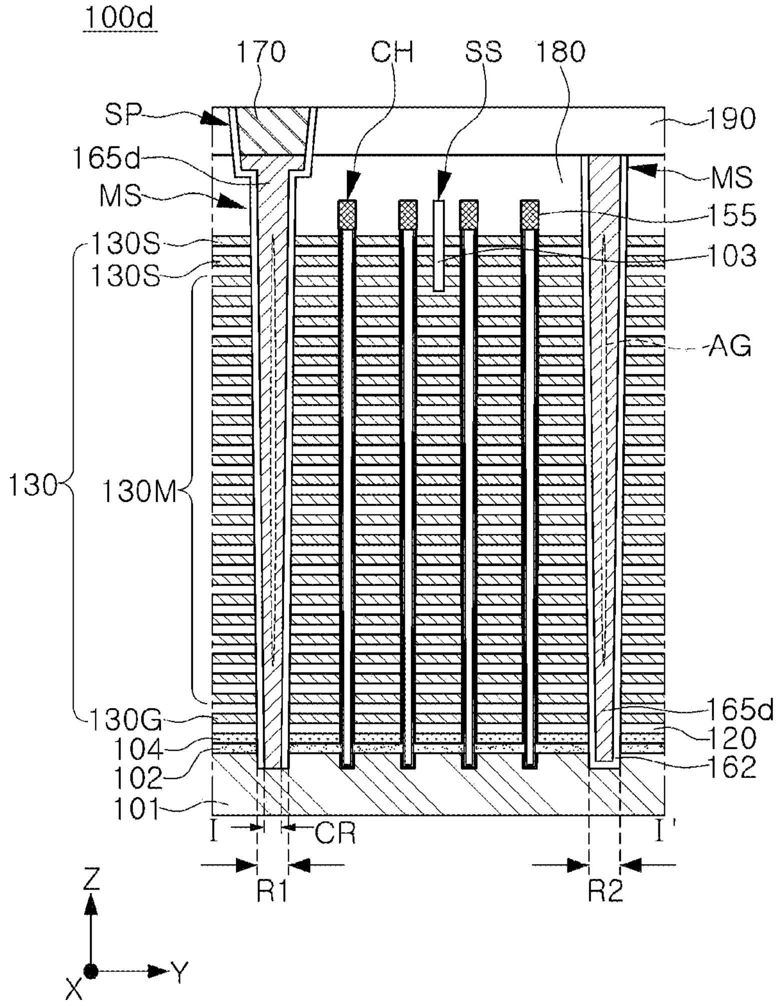
FIG. 6 is a schematic cross-sectional view of a semiconductor device according to example embodiments.

FIG. 6 is a schematic cross-sectional view of a semiconductor device according to example embodiments. The view in FIG. 6 corresponds to that in FIG. 2A.

Referring to FIG. 6, in a semiconductor device 100*d*, the separation regions MS may include the first separation insulating layer 162 and a contact conductive layer 165*d*. The contact conductive layer 165*d* may be disposed to completely fill the trench in which the separation regions MS are disposed. The contact conductive layer 165*d* may be in contact with the pad layer 170 through an upper surface. Alternatively, according to example embodiments, the contact conductive layer 165*d* and the pad layer 170 may be formed to be integrated with each other.

The contact conductive layer 165*d* may have the air-gap AG therein, but example embodiments are not limited thereto. The contact conductive layer 165*d* may be formed of a conductive material and may include, e.g., polysilicon.

Figure 7A:
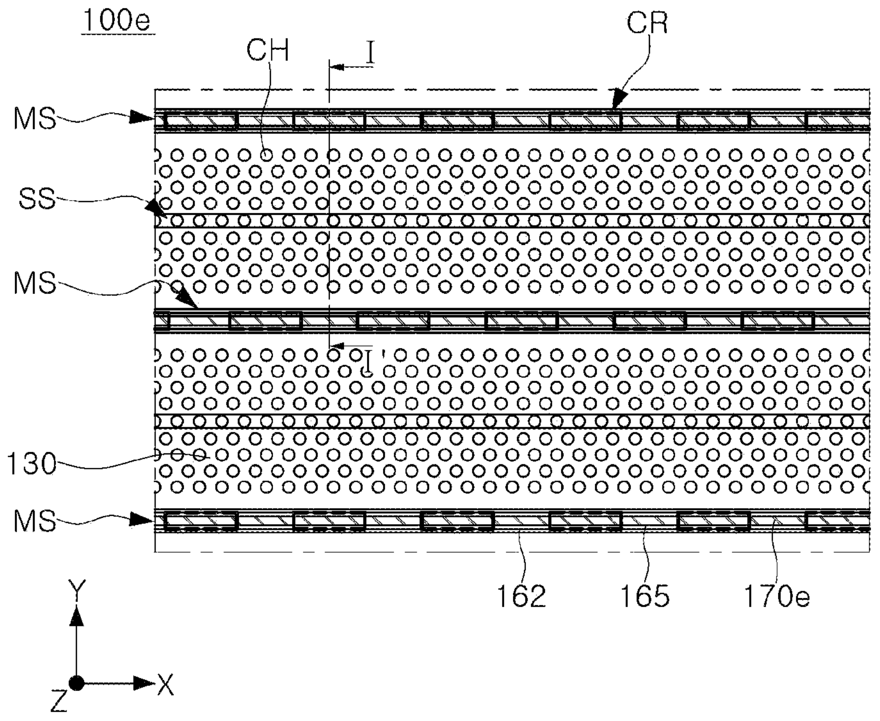
FIGS. 7A and 7B are a schematic plan view and a schematic cross-sectional view of a semiconductor device according to example embodiments, respectively.
Figure 7B:
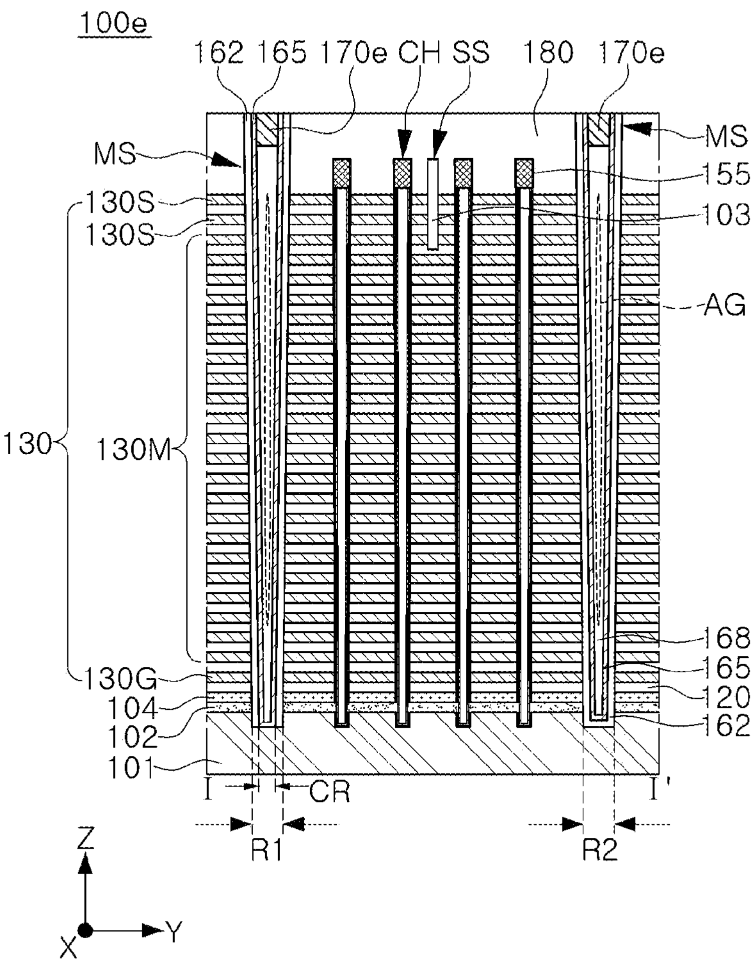

FIGS. 7A and 7B are a schematic plan view and a schematic cross-sectional view of a semiconductor device according to example embodiments, respectively. FIG. 7B is a cross-sectional view along line I-I' of FIG. 7A.

Referring to FIGS. 7A and 7B, a semiconductor device 100*e* may not include the upper support layer 190, unlike the example embodiment of FIGS. 1A to 3. The semiconductor device 100*e* may be formed by removing the upper support layer 190 during a fabrication process. Accordingly, pad layers 170*e* may be disposed to be surrounded by the first separation insulating layer 162 and the contact conductive layer 165 in an upper region including upper ends of the separation regions MS. Even in the present embodiment, the contact conductive layers 165 may be connected to the substrate 101 in only the contact regions CR.

The pad layers 170*e* may extend along the separation regions MS in the X-direction. The separation regions MS and the pad layers 170*e* may extend respectively by a substantially constant width in the X-direction. The pad layers 170*e* may extend by a width smaller than an overall width of the separation regions MS in the Y-direction. The pad layer 170*e* may have an upper surface and a lower surface disposed at a higher level higher than an uppermost upper gate electrode 130S, among a plurality of gate electrodes 130. The pad layer 170*e* may have an upper surface at a higher level than an upper surface of the channel structure CH. The pad layer 170*e* may have a lower surface disposed at a higher level than an upper surface of the channel structure CH, but example embodiments are not limited thereto.

Figure 8A:
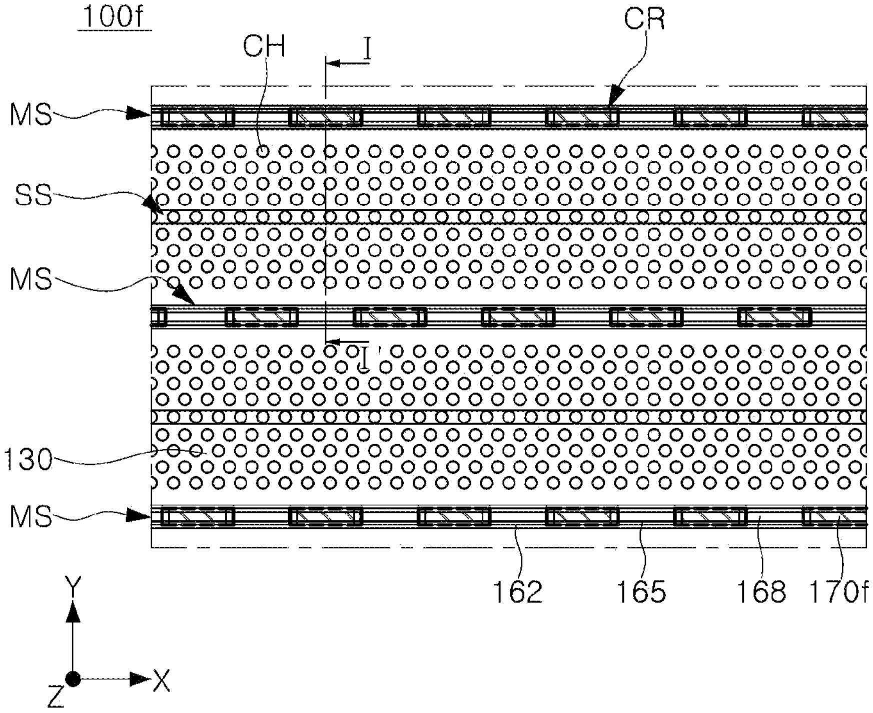
FIGS. 8A and 8B are a schematic plan view and a schematic cross-sectional view of a semiconductor device according to example embodiments, respectively.
Figure 8B:
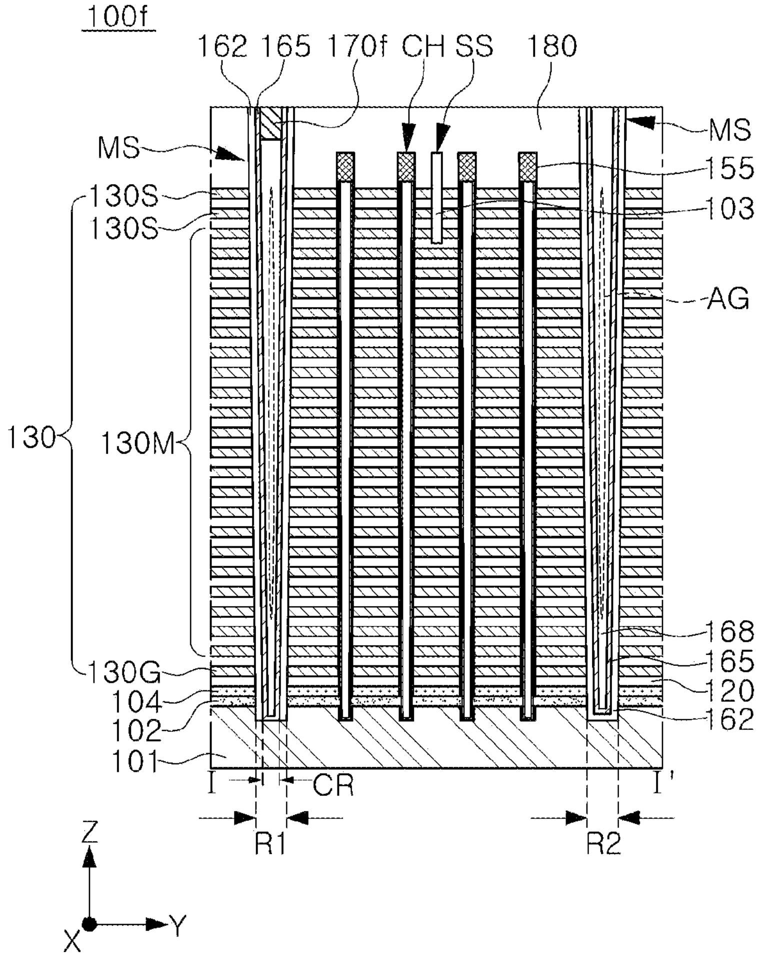

FIGS. 8A and 8B are a schematic plan view and a schematic cross-sectional view of a semiconductor device according to example embodiments, respectively. FIG. 8B is a cross-sectional view along line I-I' of FIG. 8A.

Referring to FIGS. 8A and 8B, a semiconductor device 100*f* may not include the upper support layer 190, similarly to the example embodiment of FIGS. 7A and 7B. However, unlike the example embodiment of FIGS. 7A and 7B, pad layers 170*f* may be disposed in an upper region of the separation regions MS in only some regions of the separation regions MS.

The pad layers 170*f* may be intermittently disposed along the separation regions MS in the X-direction, as illustrated in FIG. 8A. The pad layers 170*f* may be disposed on the contact regions CR. Such a structure may be a structure formed by forming the pad layers 170*f* and then removing the upper support layer 190.

Figure 9:
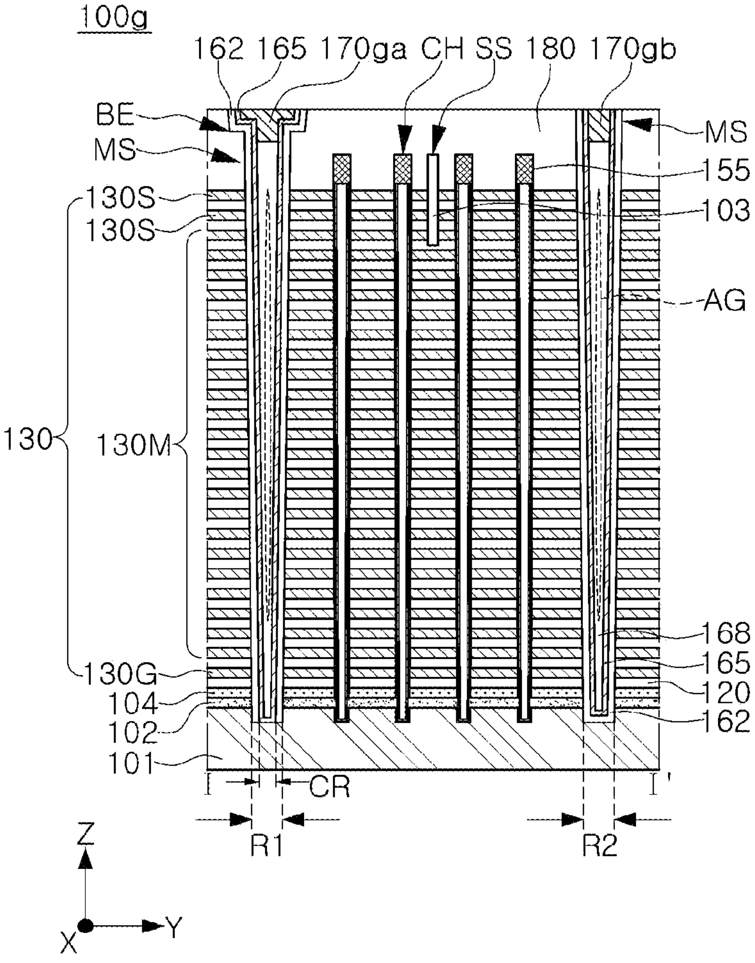
FIG. 9 is a schematic cross-sectional view of a semiconductor device according to example embodiments.

FIG. 9 is a schematic cross-sectional view of a semiconductor device according to example embodiments. The view in FIG. 9 corresponds to that in FIG. 2A.

Referring to FIG. 9, a semiconductor device 100*g* may not include the upper support layer 190, similarly to the example embodiment of FIGS. 7A and 7B. However, unlike in the example embodiment of FIGS. 7A and 7B, the separation regions MS may have the bent portion BE in an upper portion of the first region R1. Accordingly, pad layers 170*ga* and 170*gb* may have different shapes in the first region R1 and the second region R2. A first pad layer 170*ga* having a bent shape may be disposed in the first region R1, and a second pad layer 170*gb* having no bent portion may be disposed in the second region R2. Such a structure may be formed according to thicknesses of layers below the upper support layer 190 removed together when the upper support layer 190 is removed.

Figure 10:
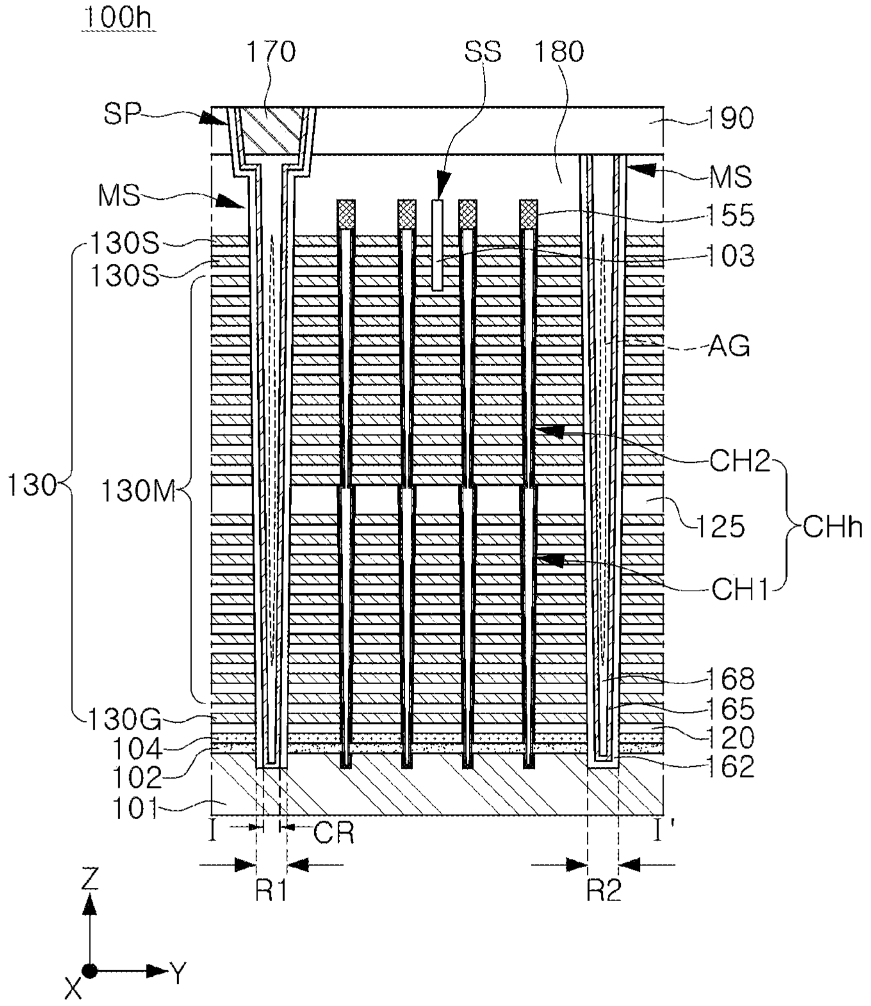
FIG. 10 is a schematic cross-sectional view of a semiconductor device according to example embodiments.

FIG. 10 is a schematic cross-sectional view of a semiconductor device according to example embodiments. The view in FIG. 10 corresponds to that in FIG. 2A.

Referring to FIG. 10, in a semiconductor device 100*h*, the first stack structure of gate electrodes 130 may include lower and upper stack structures vertically stacked, and may include first and second channel structures CH1 and CH2 in which first channel structures CHh are vertically stacked. Such a structure of the channel structures CHh may be introduced to stably form the channel structures CHh when the number of relatively stacked gate electrodes 130 is large. The number of stacked channel structures may vary according to example embodiments.

The channel structures CHh may have a shape in which lower first channel structures CH1 disposed therebelow and upper second channel structures CH2 disposed thereabove are connected to each other, and may have a bent portion formed by a width difference in a connection region. The channel layer 140, the gate dielectric layer 145, and the channel filling insulating layer 150 may be connected to each other between the first channel structure CH1 and the second channel structure CH2. The channel pad 155 may be disposed only on an upper end of the upper second channel structure CH2. However, in example embodiments, each of the first channel structure CH1 and the second channel structure CH2 may include a channel pad 155. In this case, the channel pad 155 of the first channel structure CH1 may be connected to the channel layer 140 of the second channel structure CH2. An upper interlayer insulating layer 125 having a relatively high thickness may be disposed on an uppermost portion of the lower stack structure. However, shapes of the interlayer insulating layers 120 and the upper interlayer insulating layer 125 may vary according to example embodiments. As described above, a shape of the plurality of stacked channel structures CHh may also be applied to example embodiments of FIGS. 1A to 9, 11, and 12.

Figure 11:
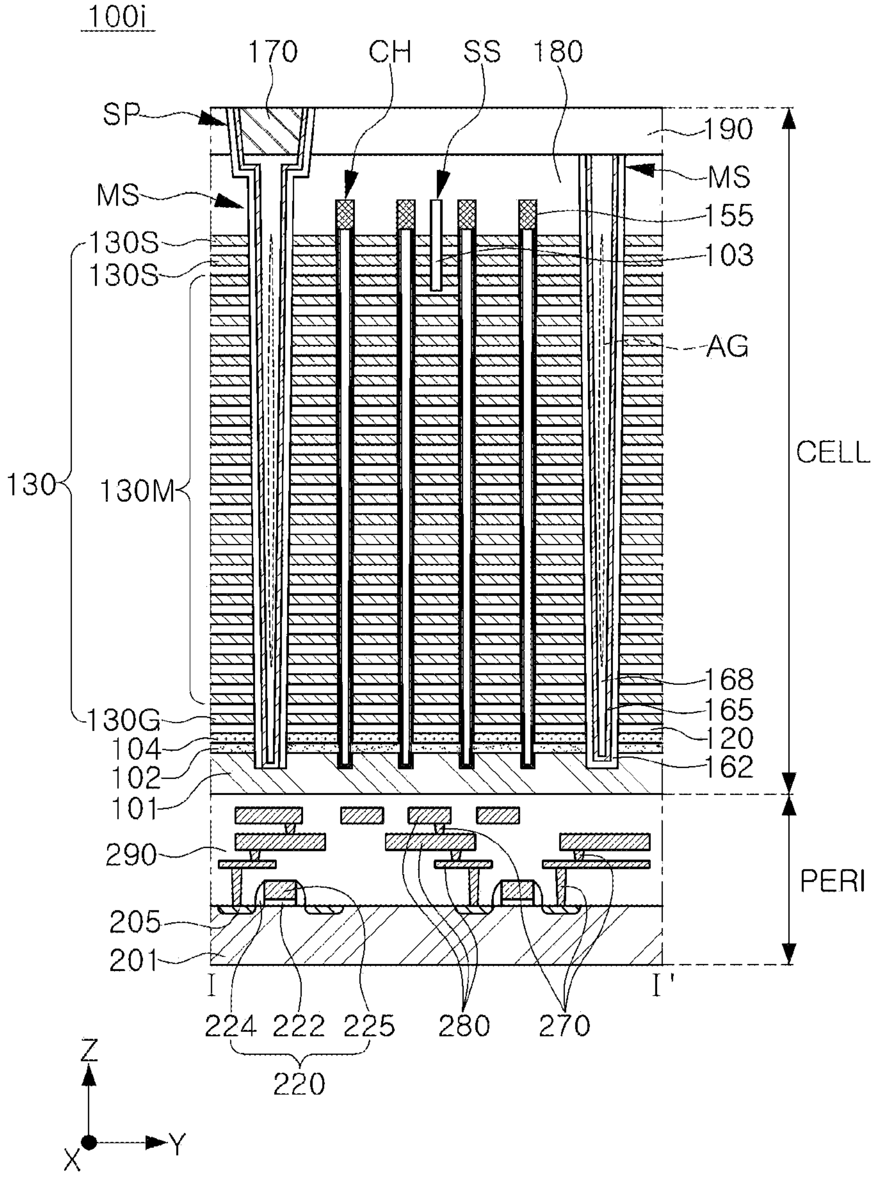
FIG. 11 is a schematic cross-sectional view of a semiconductor device according to example embodiments.

FIG. 11 is a schematic cross-sectional view of a semiconductor device according to example embodiments. The view in FIG. 11 corresponds to that in FIG. 2A.

Referring to FIG. 11, a semiconductor device 100*i* may include a memory cell region CELL and a peripheral circuit region PERI vertically stacked. The memory cell region CELL may be disposed on an upper end of the peripheral circuit region PERI. For example, in the case of the semiconductor device 100 of FIG. 2A, the peripheral circuit region PERI may be disposed on the substrate 101 in a region that is not illustrated. Alternatively, as in the semiconductor device 100*i* of the present embodiment, the peripheral circuit region PERI may be disposed in a lower portion. In example embodiments, the cell region CELL may be disposed on a lower end of the peripheral circuit region PERI. The description provided with reference to FIGS. 1A to 3 may be equally applied to a description of the memory cell region CELL.

The peripheral circuit region PERI may include a base substrate 201, circuit elements 220 disposed on the base substrate 201, circuit contact plugs 270, and circuit interconnection lines 280.

The base substrate 201 may have an upper surface extending in the X-direction and the Y-direction. In the base substrate 201, additional device isolation layers may be formed to define an active region. Source/drain regions 205, including impurities, may be formed in a portion of the active region. The base substrate 201 may include a semiconductor material, e.g., a group IV semiconductor, a group III-V compound semiconductor, or a group II-VI compound semiconductor. The base substrate 201 may be provided as a bulk wafer or an epitaxial layer. In the present embodiment, the substrate 101 disposed thereabove may be provided as a polycrystalline semiconductor layer, e.g., a polycrystalline silicon layer or an epitaxial layer.

The circuit elements 220 may include horizontal transistors. The circuit elements 220 may be electrically connected to the gate electrodes 130 and the channel structures CH. Each of the circuit elements 220 may include a circuit gate dielectric layer 222, a spacer layer 224, and a circuit gate electrode 225. Source/drain regions 205 may be formed in the base substrate 201 on opposite sides adjacent to the circuit gate electrode 225.

A peripheral region insulating layer 290 may be disposed on the circuit elements 220 on the base substrate 201. Circuit contact plugs 270 may penetrate through the peripheral region insulating layer 290 to be connected to the source/drain regions 205. An electrical signal may be applied to the circuit elements 220 by the circuit contact plugs 270. In a region, not illustrated, the circuit contact plugs 270 may also be connected to the circuit gate electrode 225. The circuit interconnection lines 280 may be connected to the circuit contact plugs 270, and may be disposed as a plurality of layers.

In the semiconductor device 100*i*, the peripheral circuit region PERI may be formed, and then the substrate 101 of the memory cell region CELL may be formed on the peripheral circuit region PERI to form the memory cell region CELL. The substrate 101 may have the same size as the base substrate 201, or may be formed to have a smaller size than the base substrate 201. The memory cell region CELL and the peripheral circuit region PERI may be connected to each other in a region, not illustrated. For example, one end of the gate electrode 130 in the Y-direction may be electrically connected to the circuit elements 220. Such a shape, in which the memory cell region CELL and the peripheral circuit region PERI are vertically stacked, may be applied to the example embodiments of FIGS. 1A to 10.

Figure 12:
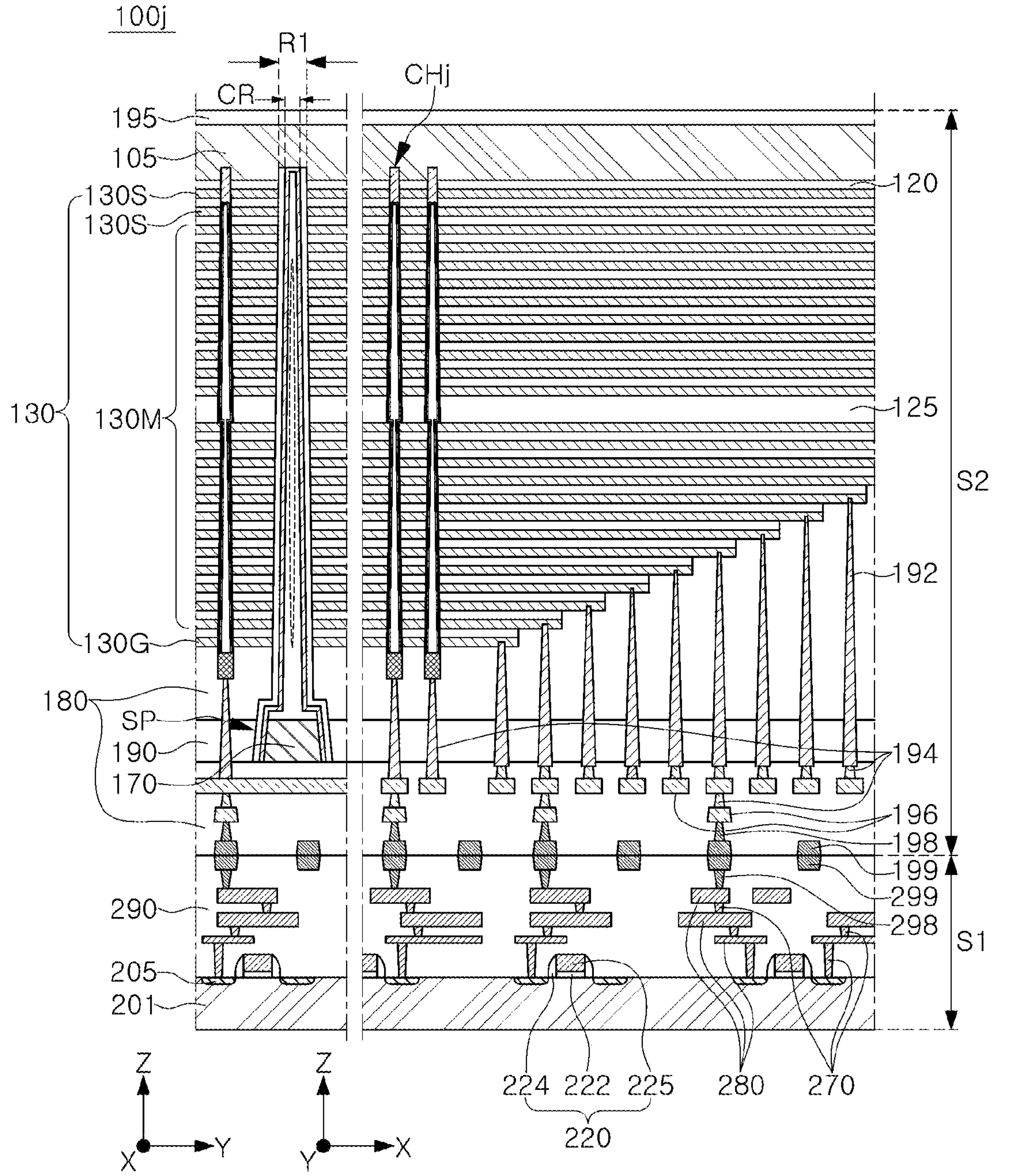
FIG. 12 is a schematic cross-sectional view of a semiconductor device according to example embodiments.

FIG. 12 is a schematic cross-sectional view of a semiconductor device according to example embodiments.

Referring to FIG. 12, a semiconductor device 100*j* may include a first structure S1 and a second structure S2 bonded in a wafer bonding manner.

The description of the peripheral circuit region PERI, provided with reference to FIG. 11, may be applied to a description of the first structure S1. However, the first structure S1 may further include first bonding vias 298 and first bonding pads 299, provided as a bonding structure. The first bonding vias 298 may be disposed on uppermost one of the circuit interconnection lines 280 to be connected to circuit interconnection lines 280. At least a portion of the first bonding pads 299 may be connected to the first bonding vias 298 on the first bonding vias 298. The first bonding pads 299 may be connected to second bonding pads 199 of the second structure S2. The first bonding pads 299 may provide an electrical connection path, together with the second bonding pads 199, according to the bonding between the first structure S1 and the second structure S2. The first bonding vias 298 and the first bonding pads 299 may include a conductive material, e.g., copper (Cu).

Unless another description is provided, the description provided with reference to FIGS. 1A to 3 will be equally applied to a description of the second structure S2. The second structure S2 may further include first cell contact plugs 192, second cell contact plugs 194, and cell interconnection lines 196, provided as an interconnection structure, and may further include second bonding vias 198 and second bonding pads 199, provided as a bonding structure. The second structure S2 may further include a passivation layer 195 covering an upper surface of the substrate 101. In addition, the second structure S2 may not include the first and second horizontal conductive layers 102 and 104 (see FIG. 2A), and channels structures CHj may further include an epitaxial layer 105.

The first cell contact plugs 192 may penetrate through the cell region insulating layer 180 and the upper support layer 190 to be connected to the gate electrodes 130. The second cell contact plugs 194 may be disposed below the first cell contact plugs 192 and the channel structures CHj, and may connect the first cell contact plugs 192 and the channel structures CHj to each other or may connect the cell interconnection lines 196 to each other. However, the number of layers and arrangement of the contact plugs and the interconnection lines, constituting the interconnection structure, may vary according to example embodiments. The first cell contact plugs 192, the second cell contact plugs 194, and the cell interconnection lines 196 may be formed of a conductive material and may include at least one of, e.g., tungsten (W), aluminum (Al), and copper (Cu).

The second bonding vias 198 and the second bonding pads 199 may be disposed below lowermost cell interconnection lines 196. The second bonding vias 198 may be connected to the cell interconnection lines 196 and the second bonding pads 199, and the second bonding pads 199 may be bonded to the first bonding pads 299 of the first structure S1. The second bonding vias 198 and the second bonding pads 199 may include a conductive material, e.g., copper (Cu).

The epitaxial layer 105 may be disposed on the substrate 101 on an upper end of the channel structure CHj, and may be disposed on a side surface of the at least one gate electrode 130. The epitaxial layer 105 may be disposed in a recessed region of the substrate 101. A height of a lower surface of the epitaxial layer 105 may be smaller than a height of a lower surface of the uppermost gate electrode 130 in FIG. 12 and larger than a height of an upper surface of a lower gate electrode 130 therebelow in FIG. 12, but example embodiments are not limited thereto. The epitaxial layer 105 may be connected to the channel layer 140 through a lower surface. The epitaxial layer 105 may be formed of a semiconductor material. A gate insulating layer may be further disposed between the epitaxial layer 105 and the gate electrode 130 in contact with the epitaxial layer 105. Such a shape of the channel structure CHj may be applied to the example embodiments of FIGS. 1A to 11.

The first structure S1 and the second structure S2 may be bonded by copper-to-copper (Cu-to-Cu) bonding using the first bonding pads 299 and the second bonding pads 199. In addition to the Cu-to-Cu bonding, the first structure S1 and the second structure S2 may be additionally bonded by dielectric-to-dielectric bonding. The dielectric-to-dielectric bonding may be a type of bonding using dielectric materials constituting a portion of each of the peripheral region insulating layer 290 and the cell region insulating layer 180 and surrounding each of the first bonding pads 299 and the second bonding pads 199. Accordingly, the first structure S1 and the second structure S2 may be bonded without an additional adhesive layer.

FIGS. 13A to 13K are schematic cross-sectional views of stages in a method of fabricating a semiconductor device according to example embodiments. FIGS. 13A to 13K illustrate regions corresponding to that in FIG. 2A.

Figure 13A:
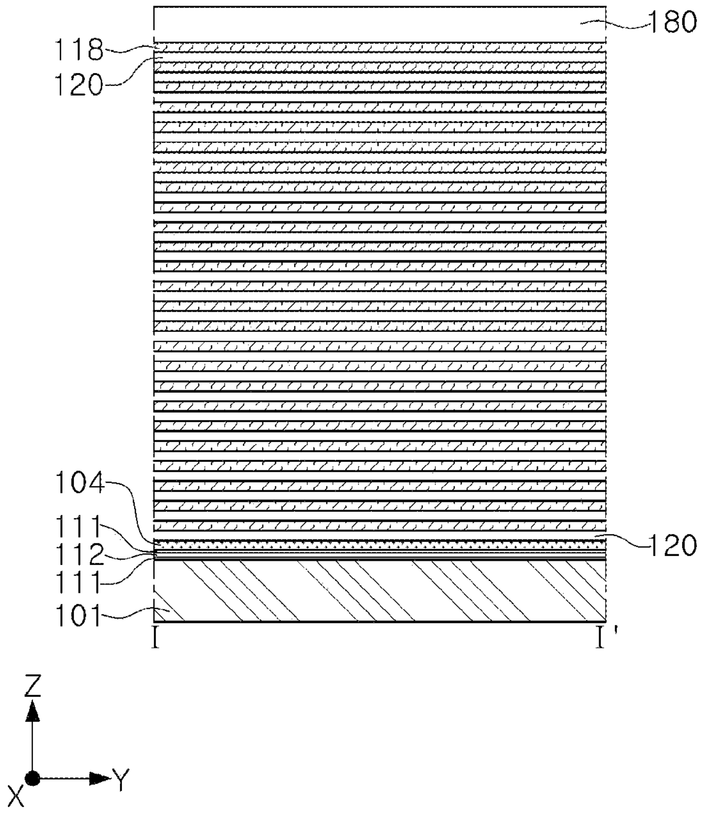
FIGS. 13A to 13K are schematic cross-sectional views of stages in a method of fabricating a semiconductor device according to example embodiments.

Referring to FIG. 13A, a first horizontal sacrificial layer 111, a second horizontal sacrificial layer 112, and the second horizontal conductive layer 104 may be formed on the substrate 101, and sacrificial insulating layers 118 and interlayer insulating layers 120 may be alternately stacked.

The first and second horizontal sacrificial layers 111 and 112 may be stacked on the substrate 101 such that the first horizontal sacrificial layers 111 are disposed above and below the second horizontal sacrificial layer 112. The first and second horizontal sacrificial layers 111 and 112 may include different materials. The first and second horizontal sacrificial layers 111 and 112 may be replaced with the first horizontal conductive layer 102 (see FIG. 2A) through a subsequent process. For example, the first horizontal sacrificial layer 111 may be formed of the same material as the interlayer insulating layers 120, and the second horizontal sacrificial layer 112 may be formed of the same material as the sacrificial insulating layers 118. The second horizontal conductive layer 104 may be formed on the first and second horizontal sacrificial layers 111 and 112.

A portion of the sacrificial insulating layers 118 may be replaced with the gate electrodes 130 (see FIG. 2A) through a subsequent process. The sacrificial insulating layers 118 may be formed of a material different from that of the interlayer insulating layers 120, and may be formed of a material which may be etched with an etching selectivity with respect to the interlayer insulating layers 120 under specific etching conditions. For example, the interlayer insulating layers 120 may be formed of at least one of silicon oxide and silicon nitride, and the sacrificial insulating layers 118 may be formed of a material different from the material of the interlayer insulating layers 120, e.g., at least one of silicon, silicon oxide, silicon carbide, and silicon nitride. In example embodiments, thicknesses of the interlayer insulating layers 120 may not all be the same. The thicknesses of the interlayer insulating layers 120 and the sacrificial insulating layers 118 and the number of layers constituting the same may be variously modified from those illustrated in the drawings. Next, a portion of a cell region insulating layer 180 may be formed to cover the sacrificial insulating layers 118 and the interlayer insulating layers 120.

Figure 13B:
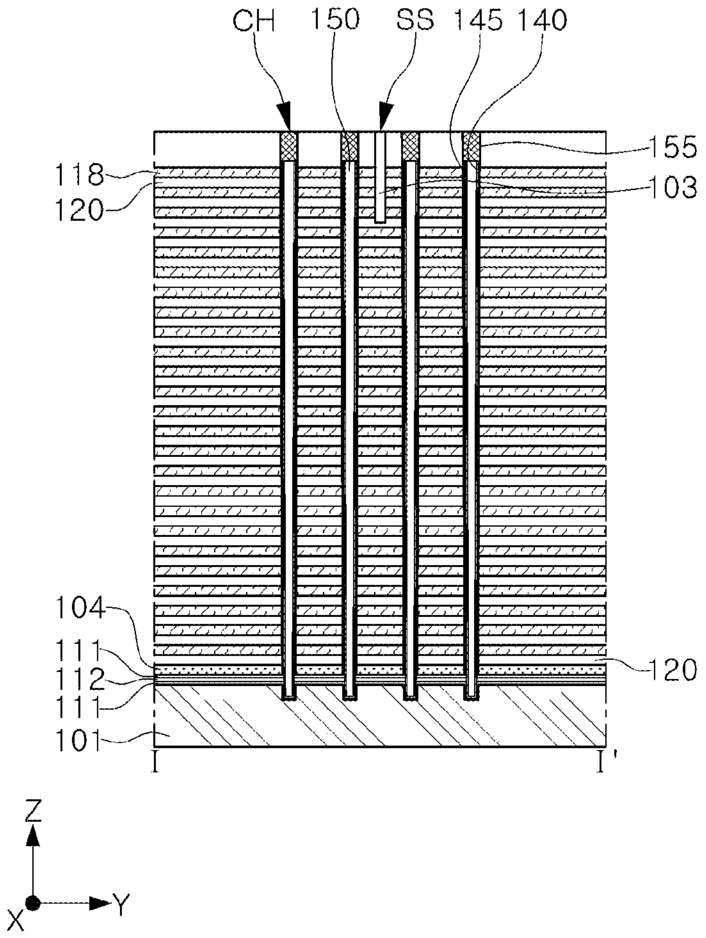

Referring to FIG. 13B, the channel structures CH may be formed to penetrate through a stack structure of the sacrificial insulating layers 118 and the interlayer insulating layers 120.

A portion of the sacrificial insulating layers 118 and the interlayer insulating layers 120 may be removed to form the upper separation regions SS. A region, in which the upper separation regions SS are to be exposed, may be exposed using an additional mask layer, a predetermined number of the sacrificial insulating layers 118 and the interlayer insulating layers 120 may be removed from an uppermost portion, and then an insulating material may be deposited to form the upper separation insulating layer 103.

The channel structures CH may be formed by anisotropically etching the sacrificial insulating layers 118 and the interlayer insulating layers 120, and may be formed by forming hole-like channel holes and filling the channel holes. Due to a height of the stack structure, sidewalls of the channel structures CH may not be perpendicular to an upper surface of the substrate 101. The channel structures CH may be formed to recess a portion of the substrate 101. Next, at least a portion of the gate dielectric layer 145, the channel layer 140, the channel filling insulating layer 150, and the channel pad 155 may be sequentially formed in the channel structures CH.

The gate dielectric layer 145 may be formed to have a uniform thickness, e.g., using an atomic layer deposition (ALD) or chemical vapor deposition (CVD) process. In the present operation, an entirety or a portion of the gate dielectric layer 145 may be formed, and a portion extending along the channel structures CH in a direction perpendicular to the substrate 101 may be formed. The channel layer 140 may be formed on the gate dielectric layer 145 in the channel structures CH. The channel filling insulating layer 150 may be formed to fill the channel structures CH, and may include an insulating material. The channel pad 155 may be formed of a conductive material, e.g., polysilicon.

Figure 13C:
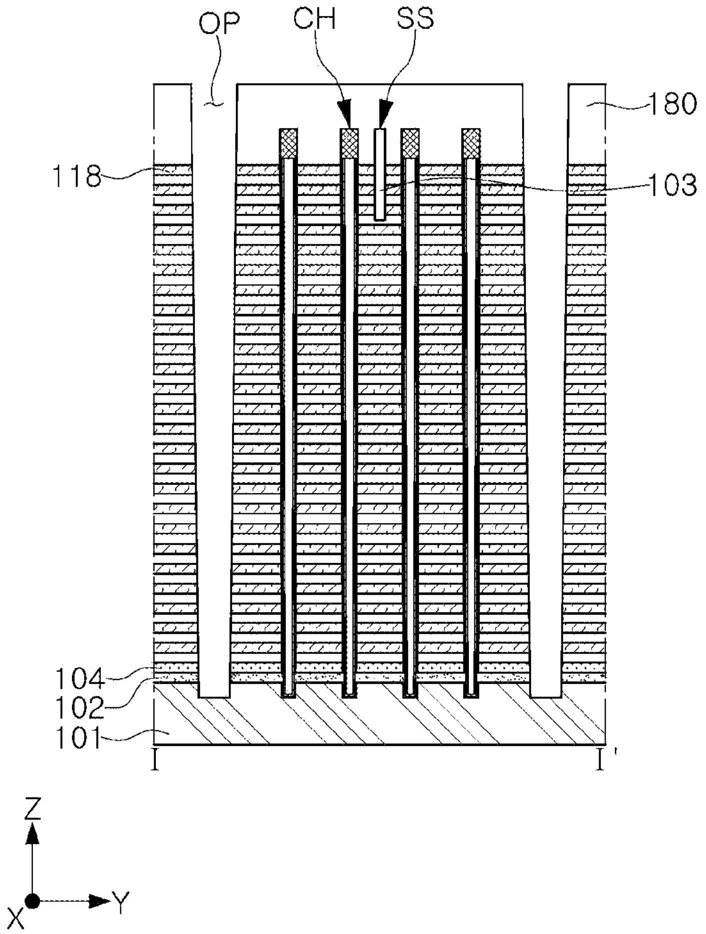

Referring to FIG. 13C, in regions corresponding to the separation regions MS (see FIG. 1), trenches OP may be formed to penetrate through the stack structure of the sacrificial insulating layers 118 and the interlayer insulating layers 120 and through the first horizontal conductive layer 102.

The cell region insulating layer 180 may be additionally formed on the channel structures CH, and then the trenches OP may be formed. The trenches OP may be formed to penetrate through the stack structure of the sacrificial insulating layers 118 and the interlayer insulating layers 120 to extend from below through the second horizontal conductive layer 104 in the X-direction. Next, the second horizontal sacrificial layer 112 may be exposed by an etch-back process while forming additional sacrificial spacer layers in the trenches OP. The exposed second horizontal sacrificial layer 112 may be selectively removed, and then the first horizontal sacrificial layers 111 disposed thereabove and therebelow may be removed.

The first and second horizontal sacrificial layers 111 and 112 may be removed by, e.g., a wet etching process. In the process of removing the first and second horizontal sacrificial layers 111 and 112, an exposed portion of the gate dielectric layer 145 may also be removed in a region in which the second horizontal sacrificial layer 112 is removed. A conductive material may be deposited in the region, in which the first and second horizontal sacrificial layers 111 and 112 are removed, to form a first horizontal conductive layer, and then the sacrificial spacer layers may be removed in the trenches OP.

Figure 13D:
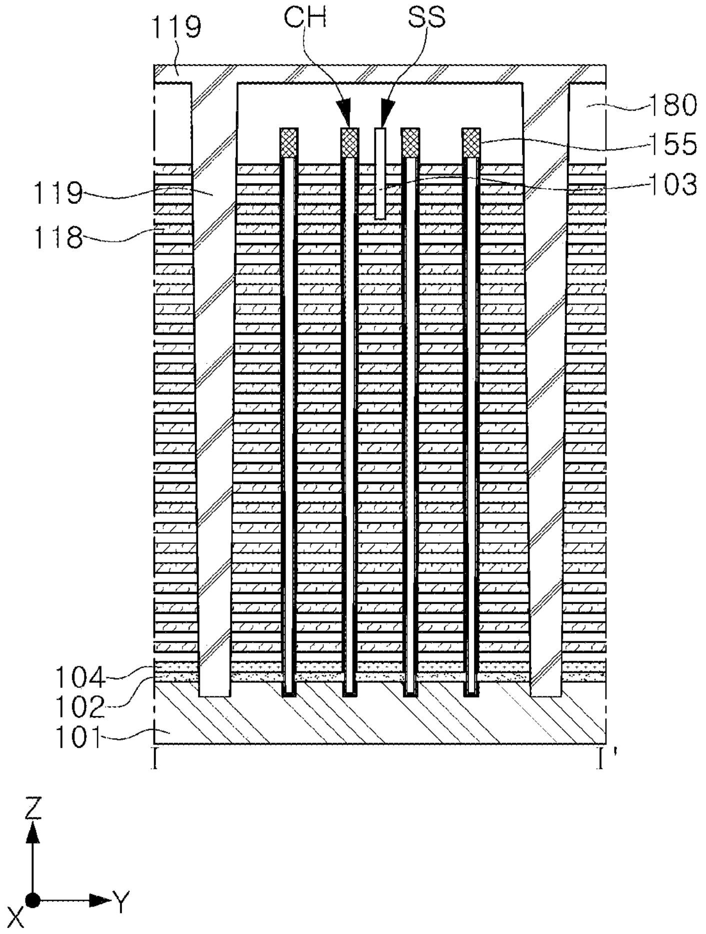

Referring to FIG. 13D, a vertical sacrificial layer 119 filling the trenches OP may be formed. The vertical sacrificial layer 119 may be formed to fill the trenches OP. The vertical sacrificial layer 119 may include a single layer or a plurality of layers. For example, the vertical sacrificial layer 119 may include a silicon nitride/polysilicon double layer.

Figure 13E:
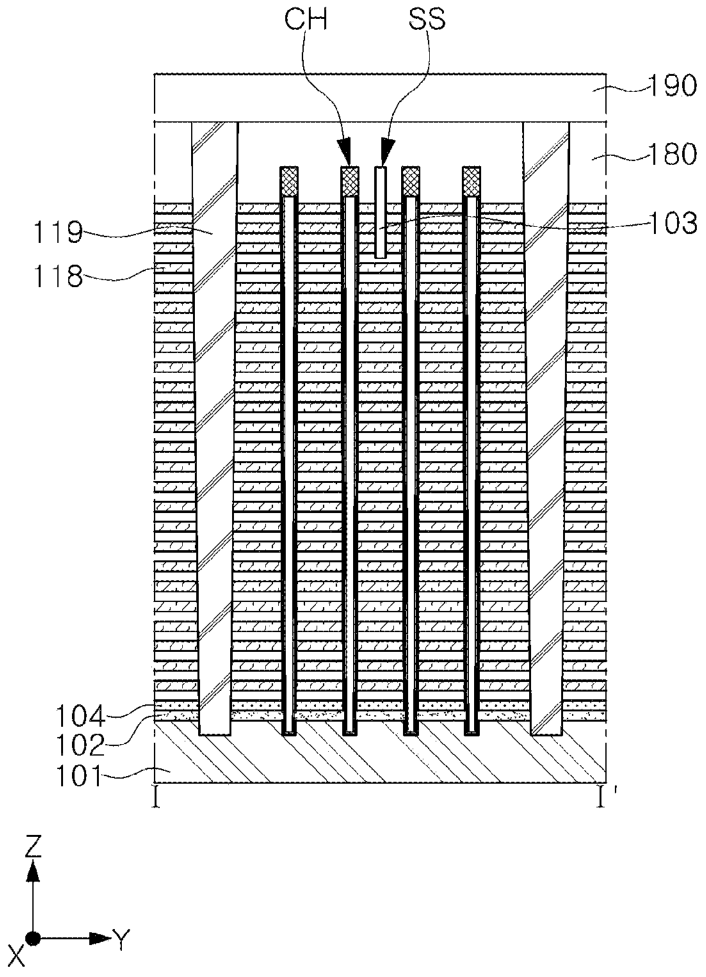

Referring to FIG. 13E, the upper support layer 190 may be formed on the cell region insulating layer 180.

The vertical sacrificial layer 119 may be removed from a top surface of the cell region insulating layer 180 by a planarization process such that the vertical sacrificial layer 119 is disposed in only the trenches OP. Next, the upper support layer 190 may be formed on the vertical sacrificial layer 119 and the cell region insulating layer 180. The upper support layer 190 may support a stack structure of the interlayer insulating layers 120 during a subsequent process of removing the sacrificial insulating layers 118.

Figure 13F:
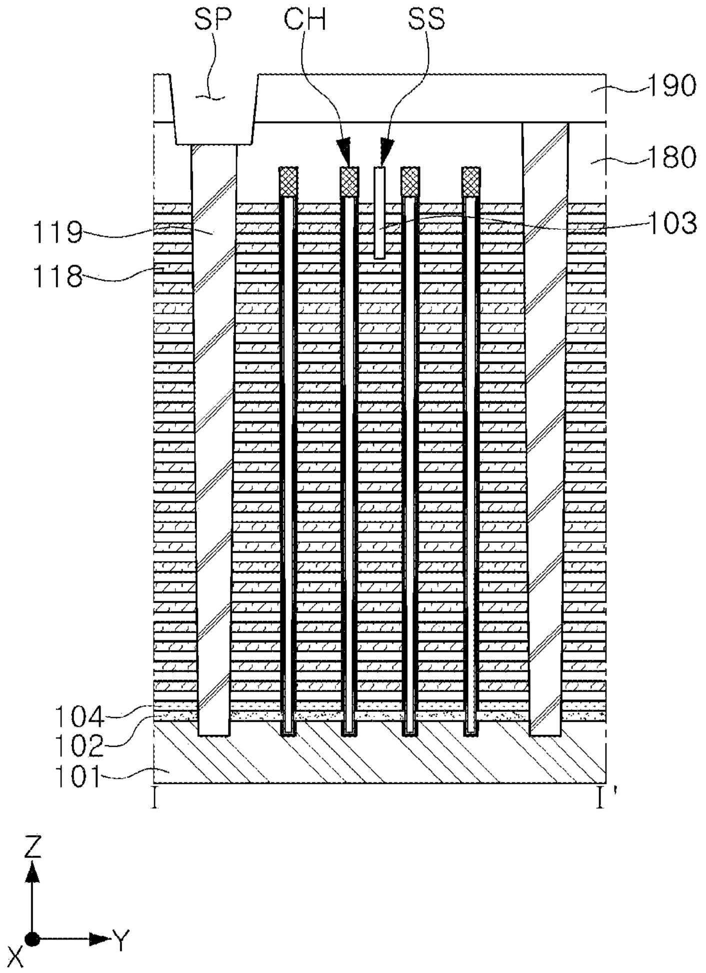

Referring to FIG. 13F, a portion of the upper support layer 190 may be removed to form the openings SP. The openings SP may be formed to expose the vertical sacrificial layer 119 in some regions along the vertical sacrificial layer 119 extending in a line shape.

For example, the openings SP may be formed to be deeper than a lower surface of the upper support layer 190, and thus, may be formed while removing a portion of the cell region insulating layer 180 and a portion of the vertical sacrificial layer 119. However, according to example embodiments, the openings SP may be formed to have substantially the same depth as the lower surface of the upper support layer 190, as in the example embodiment of FIG. 4B.

As described above with reference to FIG. 1A, the openings SP may be formed to be offset, e.g., shifted, from each other in the Y-direction. Relative sizes of the openings SP may vary according to example embodiments.

Figure 13G:
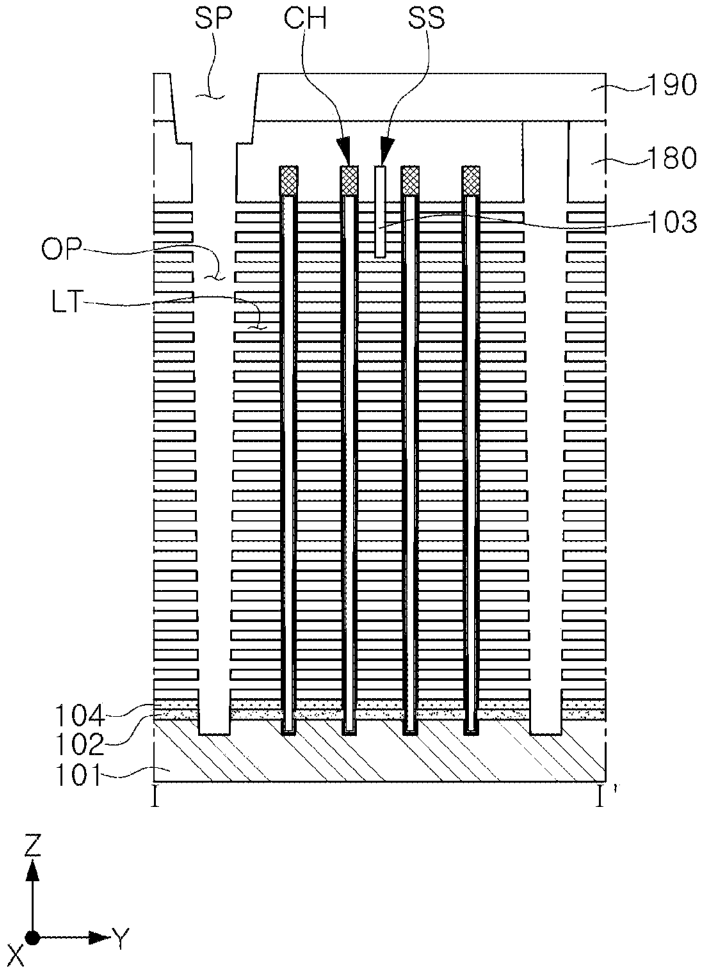

Referring to FIG. 13G, the vertical sacrificial layer 119 may be removed through the openings SP to re-form the trenches OP, and the sacrificial insulating layers 118 may be removed through the trenches OP to form tunnel portions LT. The vertical sacrificial layer 119 may be selectively removed through the openings SP.

Next, the sacrificial insulating layers 118 may be selectively removed through the trenches OP. The vertical sacrificial layer 119 and the sacrificial insulating layers 118 may be selectively removed with respect to the interlayer insulating layers 120 using, e.g., a wet etching process. Accordingly, the plurality of tunnel portions LT may be formed between the interlayer insulating layers 120.

Figure 13H:
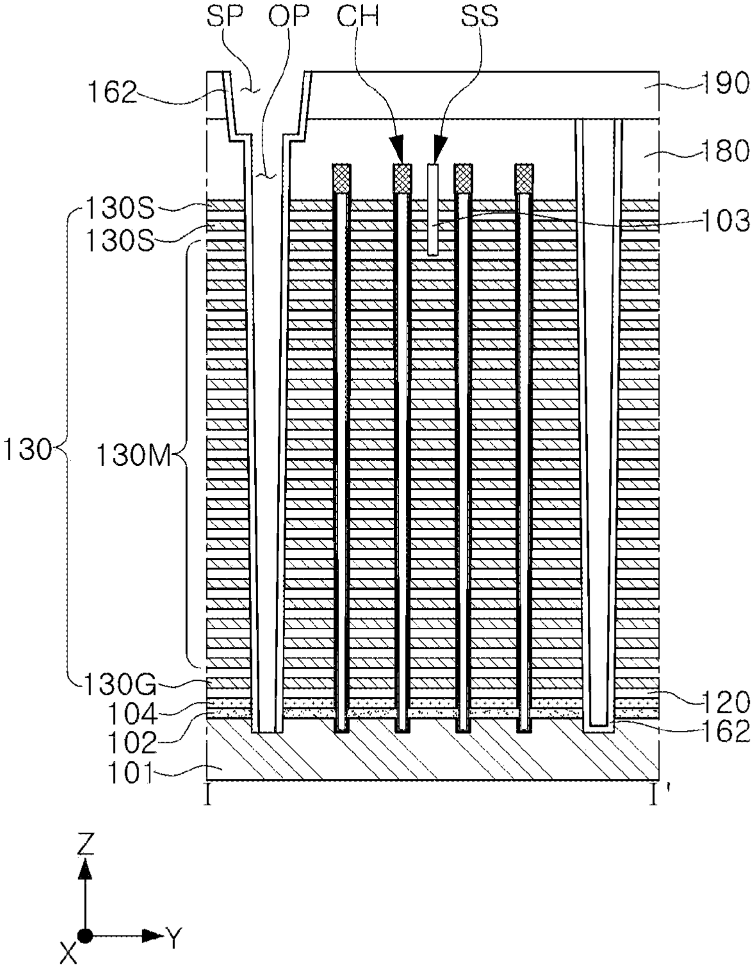

Referring to FIG. 13H, the gate electrodes 130 may be formed by filling the tunnel portions LT, in which a portion of the sacrificial insulating layers 118 is removed, with a conductive material, and the first separation insulating layer 162 may be formed.

The conductive material forming the gate electrodes 130 may fill the tunnel portions LT. The conductive material may include, e.g., a metal, polysilicon, or a metal silicide material. After forming the gate electrodes 130, the conductive material deposited in the trenches OP may be removed by an additional process, and then the first separation insulating layer 162 may be formed. When the conductive material is removed, a portion of the gate electrodes 130 may be removed from the trenches OP. In this case, the first separation insulating layer 162 may include regions having a portion horizontally extending from the trenches OP to side surfaces of the gate electrodes 130.

The first separation insulating layer 162 may be formed to have a relatively low thickness to cover internal sidewalls and bottom surfaces of the trenches OP. Then, portions of the first separation insulating layer 162 formed on the bottom surfaces of the trenches OP may be removed through the openings SP. For example, the first separation insulating layer 162 may be removed from the substrate 101 in a region overlapping the openings SP using an etch-back process. Accordingly, the substrate 101 may be exposed from the bottom surfaces of the trenches OP in the region overlapping the openings SP, and the first separation insulating layer 162 may remain on the substrate 101 on the bottom surfaces of the trenches OP in a region not overlapping the openings SP.

Figure 13I:
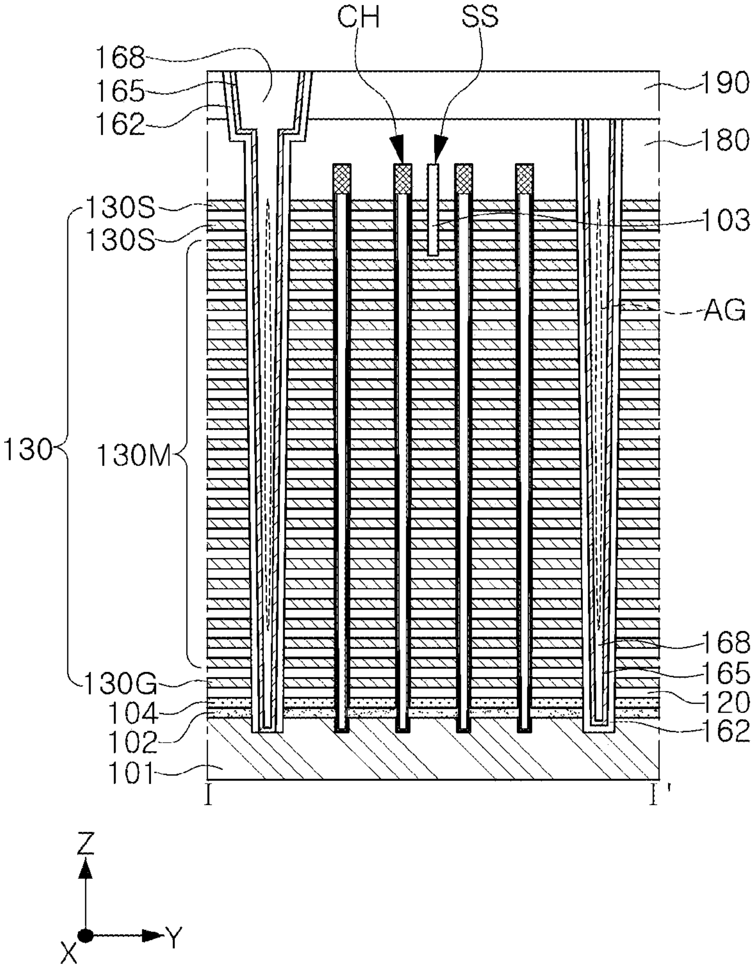

Referring to FIG. 13I, the contact conductive layer 165 and the second separation insulating layer 168 may be further formed in the trenches OP.

The contact conductive layer 165 and the second separation insulating layer 168 may be sequentially stacked on the first separation insulating layer 162. The contact conductive layer 165 and the second separation insulating layer 168 may also be formed to fill the openings SP. The contact conductive layer 165 may be formed to have a relatively low thickness, but example embodiments are not limited thereto, e.g., the contact conductive layer 165 may be formed to completely fill the trenches OP as in FIG. 6. The second separation insulating layer 168 may be formed on the contact conductive layer 165 to completely fill the trenches OP. The air-gap AG may be formed in the second separation insulating layer 168 during the formation of the second separation insulating layer 168, but example embodiments are not limited thereto.

Figure 13J:
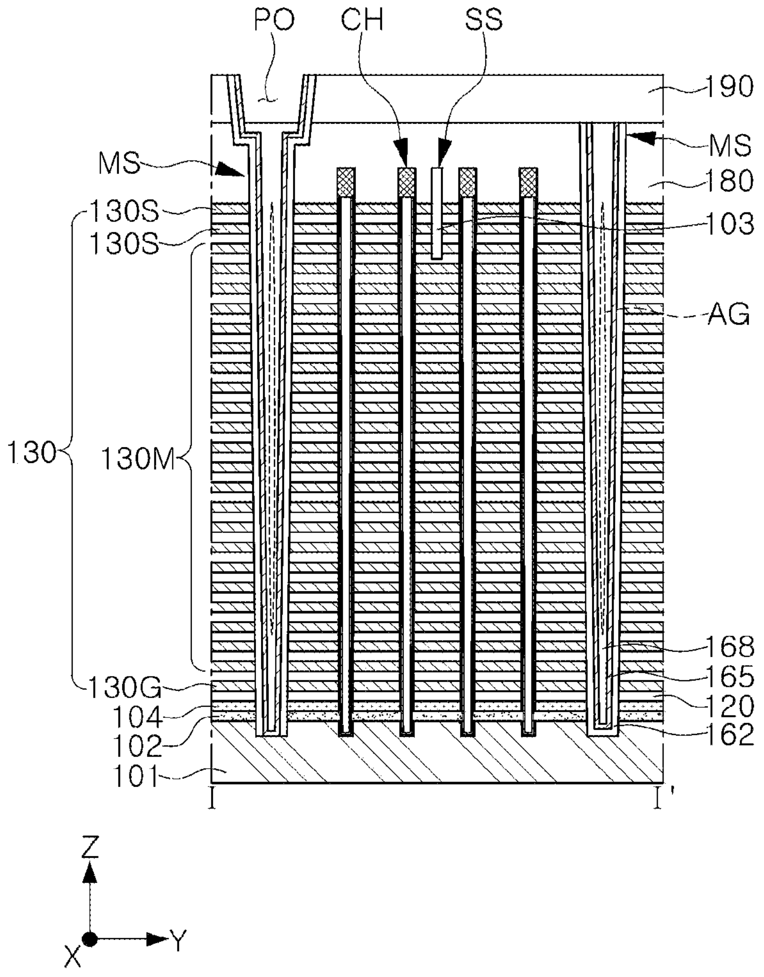

Referring to FIG. 13J, a portion of the second separation insulating layer 168 may be removed from above to form a pad region PO.

A portion of the second separation insulating layer 168 may be selectively removed from an upper surface. A depth and a shape of removal of the second separation insulating layer 168 may vary according to example embodiments. The second separation insulating layer 168 remaining below the pad region PO may constitute a separation region MS.

For example, in the case of the example embodiment of FIG. 4A, the second separation insulating layer 168 may be removed to be relatively deep. In the example embodiment of FIG. 4B, the second separation insulating layer 168 may be removed to be relatively shallow. In the case of the example embodiment of FIG. 5, the present operation and subsequent operations of forming the pad layer 170 (see FIG. 13K) may be omitted.

In the case of the example embodiment of FIGS. 7A to 9, in the present operation, a portion of an upper region including the upper support layer 190 may be removed and the pad region PO may be formed. The upper region may be removed by an etch-back process or a planarization process. Then, a portion of the exposed second separation insulating layer 168 may be removed to form the pad region PO in the form of being recessed inwardly of the separation region MS.

Figure 13K:
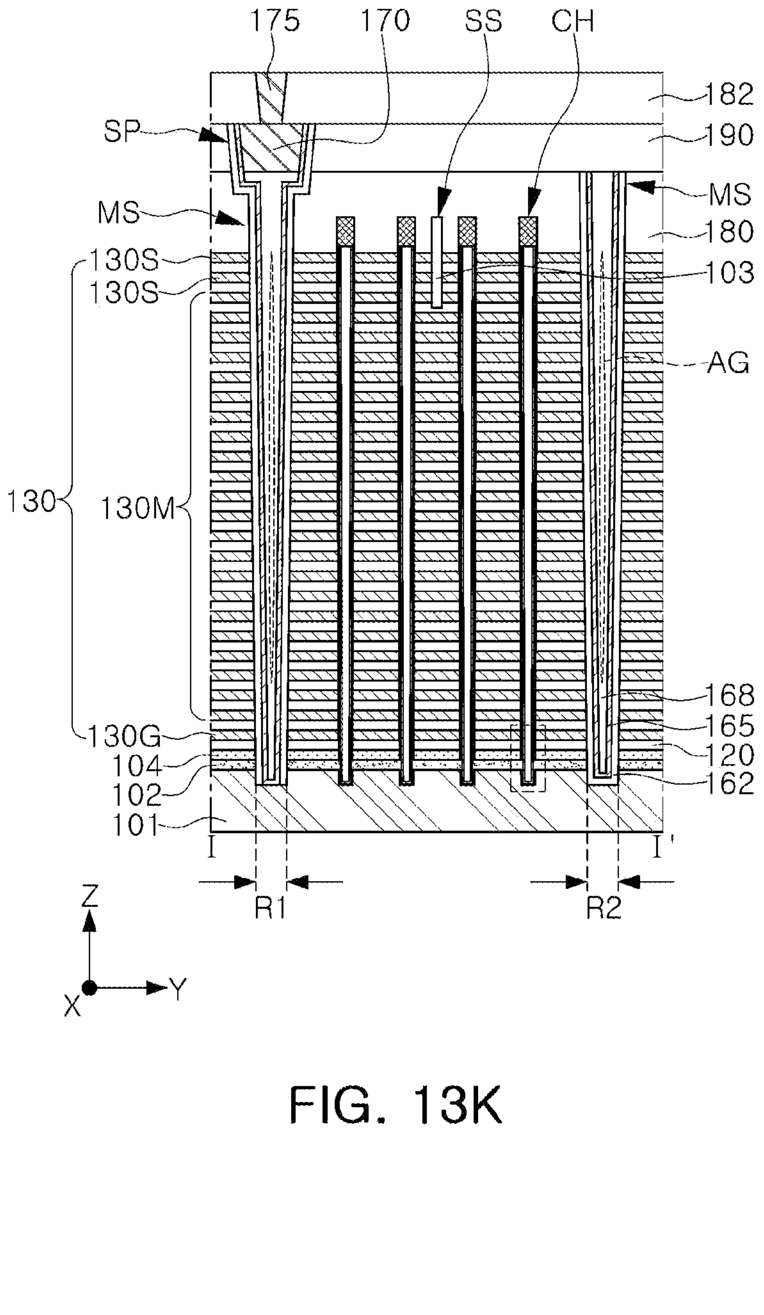

Referring to FIG. 13K, the pad layer 170 may be formed in the pad region PO. The pad layer 170 may be formed by filling the pad region PO with a conductive material and performing a planarization process.

After formation of the pad layer 170, as illustrated in FIG. 13K, an additional cell region insulating layer 182 may be formed and a pad contact plug 175 may be further formed to be connected to the pad layer 170 through the additional cell region insulating layer 182. However, the pad contact plug 175 is an example of an upper interconnection structure connected to the pad layer 170, and a form of the upper interconnection structure connecting to the pad layer 170 may vary according to example embodiments.

Figure 14:
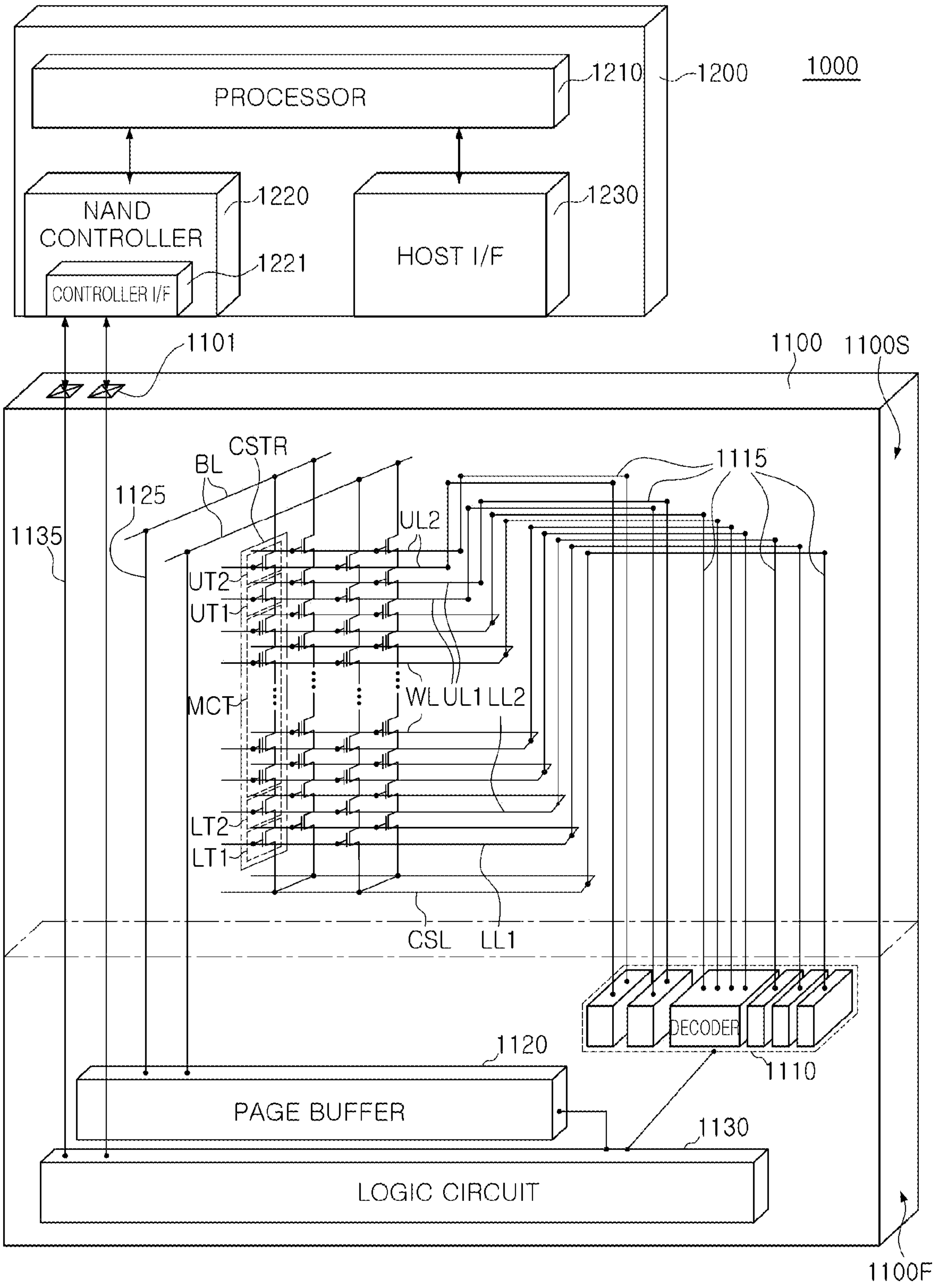
FIG. 14 is a schematic view of a data storage system including a semiconductor device according to example embodiments.

FIG. 14 is a schematic view of a data storage system including a semiconductor device according to example embodiments.

Referring to FIG. 14, a data storage system 1000 may include a semiconductor device 1100 and a controller 1200 electrically connected to the semiconductor device 1100. The data storage system 1000 may be a storage device, including one or more semiconductor devices 1100, or an electronic device including a storage device. For example, the data storage system 1000 may be a solid state drive device (SSD) device including one or more semiconductor devices 1100, a universal serial bus (USB), a computing system, a medical device, or a communications device.

The semiconductor device 1100 may be or include a nonvolatile memory device and may be, e.g., the NAND flash memory device described with reference to FIGS. 1 to 12. The semiconductor device 1100 may include a first structure 1100F and a second structure 1100S on the first structure 1100F. In example embodiments, the first structure 1100F may be disposed alongside the second structure 1100S. In example embodiments, the first structure 1100F may be a peripheral circuit structure including a decoder circuit 1110, a page buffer 1120, and a logic circuit 1130. The second structure 1100S may be a memory cell structure including a bitline BL, a common source line CSL, wordlines WL, first and second upper gate lines UL1 and UL2, first and second lower gate lines LL1 and LL2, and memory cell strings CSTR between the bitline BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT disposed between the lower transistors LT1 and LT2 and the upper transistors UT1 and UT2. The number of the lower transistors LT1 and LT2 and the number of the upper transistors UT1 and UT2 may vary according to example embodiments.

In example embodiments, the upper transistors UT1 and UT2 may include string select transistor, and the lower transistors LT1 and LT2 may include a ground select transistor. The lower gate lines LL1 and LL2 may be gate electrodes of the lower transistors LT1 and LT2, respectively. The wordlines WL may be gate electrodes of the memory cell transistors MCT, and the upper gate lines UL1 and UL2 may be gate electrodes of the upper transistors UT1 and UT2, respectively.

In some example embodiments, the lower transistors LT1 and LT2 may include a lower erase control transistor LT1 and a ground select transistor LT2 connected in series. The upper transistors UT1 and UT2 may include a string select transistor UT1 and an upper erase control transistor UT2 connected in series. At least one of the lower erase control transistor LT1 and the upper erase control transistor UT1 may be used in an erase operation in which data, stored in memory cell transistors MCT, is erased using gate-induced drain leakage (GIDL) current.

The common source line CSL, the first and second lower gate lines LL1 and LL2, the wordlines WL, and the first and second upper gate lines UL1 and UL2 may be electrically connected to the decoder circuit 1110 through first interconnections 1115, extending to the second structure 1100S, within the first structure 1100F. The bitlines BL may be connected to the page buffer 1120 through second interconnections 1125, extending to the second structure 1100S, within the first structure 1100F.

In the first structure 1100F, the decoder circuit 1110 and the page buffer 1120 may perform a control operation on at least one memory cell transistor MCT, among a plurality of memory cell transistors MCT. The decoder circuit 1110 and the page buffer 1120 may be controlled by the logic circuit 1130. The data storage system 1000 may communicate with the controller 1200 through an input/output (I/O) pad 1101 electrically connected to the logic circuit 1130. The I/O pad 1101 may be electrically connected to the logic circuit 1130 through an input/output (I/O) interconnection 1135, extending to the second structure 1100S, within the first structure 1100F.

The controller 1200 may include a processor 1210, a NAND controller 1220, and a host interface (I/F) 1230. According to example embodiments, the data storage system 1000 may include a plurality of semiconductor devices 1100. In this case, the controller 1200 may control the plurality of semiconductor devices 1100.

The processor 1210 may control overall operation of the data storage system 1000 including the controller 1200. The processor 1210 may operate based on predetermined firmware, and may control a NAND controller 1220 to access the semiconductor device 1100. The NAND controller 1220 may include a NAND interface 1221 processing communications with the semiconductor device 1100. A control command for controlling the semiconductor device 1100, data to be written to the memory cell transistors MCT of the semiconductor device 1100, data to be read from the memory cell transistors MCT of the semiconductor device 1100, and the like, may be transmitted through the NAND interface 1221. The host interface 1230 may provide a communications function between the data storage system 1000 and an external host. When a control command is received from the external host through the host interface 1230, the processor 1210 may control the semiconductor device 1100 in response to the control command.

Figure 15:
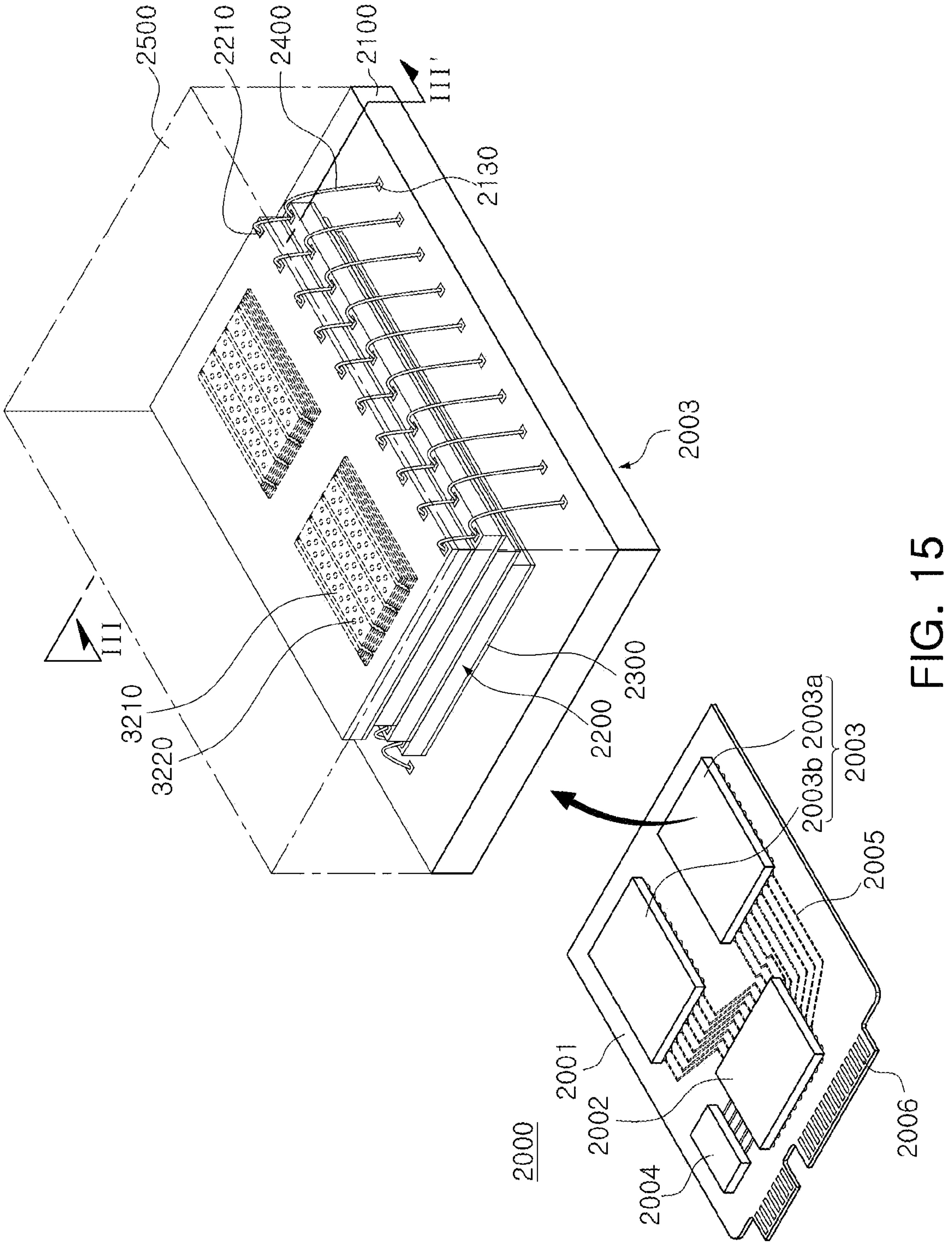
FIG. 15 is a schematic perspective view of a data storage system according to example embodiments.

FIG. 15 is a schematic perspective view of a data storage system according to example embodiments.

Referring to FIG. 15, a data storage system 2000 according to example embodiments may include a main substrate 2001, a controller 2002 mounted on the main substrate 2001, one or more semiconductor packages 2003, and a dynamic random-access memory (DRAM) 2004. The semiconductor package 2003 and the DRAM 2004 may be connected to the controller 2002 through interconnection patterns 2005 formed on the main substrate 2001.

The main substrate 2001 may include a connector 2006 including a plurality of pins coupled to the external host. In the connector 2006, the number and disposition of the plurality of pins may vary depending on a communications interface between the data storage system 2000 and the external host. In example embodiments, the data storage system 2000 may communicate with the external host based on an interface, among interfaces such as universal serial bus (USB), peripheral component interconnect express (PCI-Express), serial advanced technology attachment (SATA), M-PHY for universal flash storage (UFS), and the like. In example embodiments, the data storage system 2000 may operate with power supplied from the external host through a connector 2006. The data storage system 2000 may further include a power management integrated circuit (PMIC) dividing the power, supplied from the external host, to the controller 2002 and the semiconductor package 2003.

The controller 2002 may write data to the semiconductor package 2003 or read data from the semiconductor package 2003, and may increase operating speed of the data storage system 2000.

The DRAM 2004 may be a buffer memory for reducing a difference in speeds between the semiconductor package 2003, used as a data storage space, and the external host. The DRAM 2004, included in the data storage system 2000, may operate as a type of cache memory and may provide a space for temporarily storing data during a control operation for the semiconductor package 2003. When the DRAM 2004 is included in the data storage system 2000, the controller 2002 may further include a DRAM controller for controlling the DRAM 2004, in addition to a NAND controller for controlling the semiconductor package 2003.

The semiconductor package 2003 may include first and second semiconductor packages 2003*a* and 2003*b* spaced apart from each other. Each of the first and second semiconductor packages 2003*a* and 2203*b* may be a semiconductor package including a plurality of semiconductor chips 2200. Each of the first and second semiconductor packages 2003*a* and 2003*b* may include a package substrate 2100, semiconductor chips 2200 on the package substrate 2100, adhesive layers 2300, respectively disposed on lower surfaces of the semiconductor chips 2200, a connection structure 2400 electrically connecting the semiconductor chips 2200 and the package substrate 2100 to each other, and a molding layer 2500 covering the semiconductor chips 2200 and the connection structure 2400 on the package substrate 2100.

The package substrate 2100 may be a printed circuit board (PCB) including upper package pads 2130. Each of the semiconductor chips 2200 may include an input/output (I/O) pad 2210. The I/O pad 2210 may correspond to the I/O pad 1101 of FIG. 14. Each of the semiconductor chips 2200 may include gate stack structures 3210 and channel structures 3220. Each of the semiconductor chips 2200 may include the semiconductor device described with reference to FIGS. 1 to 12.

In example embodiments, the connection structure 2400 may be a bonding wire electrically connecting the I/O pad 2210 and the upper package pads 2130 to each other. Accordingly, in each of the first and second semiconductor packages 2003*a* and 2003*b*, the semiconductor chips 2200 may be electrically connected to each other by wire bonding, and may be electrically connected to the upper package pads 2130 of the package substrate 2100. According to example embodiments, in each of the first and second semiconductor packages 2003*a* and 2003*b*, the semiconductor chips 2200 may be electrically connected to each other by a connection structure including a through-silicon via (TSV), rather than the connection structure 2400 using wire bonding.

In example embodiments, the controller 2002 and the semiconductor chips 2200 may be included in a single package. In example embodiments, the controller 2002 and the semiconductor chips 2200 may be mounted on an additional interposer substrate, different from the main substrate 2001, and the controller 2002 and the semiconductor chips 2200 may be connected to each other by an interconnection formed on the interposer substrate.

Figure 16:
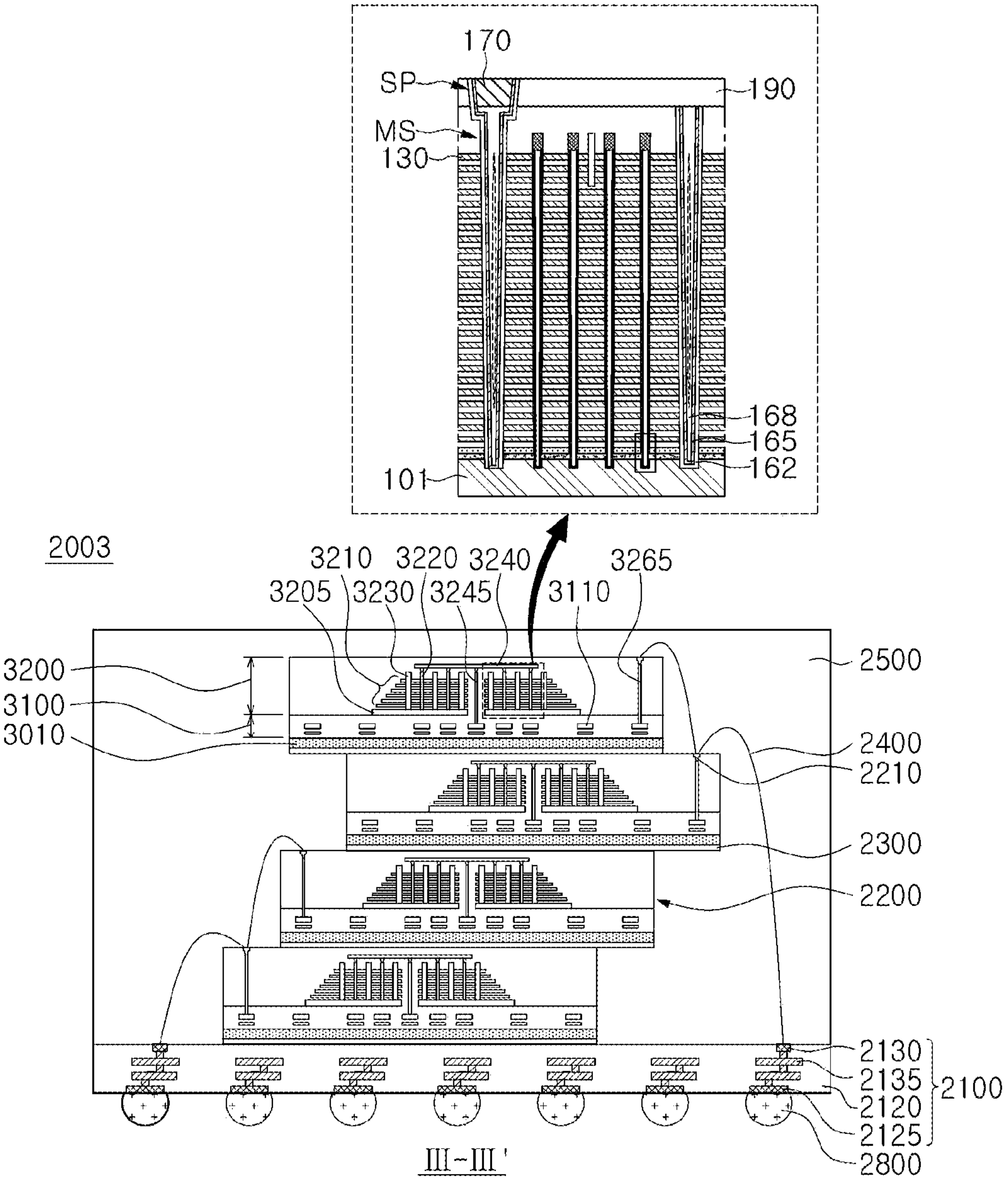
FIG. 16 is a schematic cross-sectional view of a semiconductor package according to example embodiments.

FIG. 16 is a schematic cross-sectional view of a semiconductor package according to example embodiments. FIG. 16 illustrates an example embodiment of the semiconductor package 2003 of FIG. 15, and conceptually illustrates a region taken along line III-III' of the semiconductor package 2003 of FIG. 15.

Referring to FIG. 16, in a semiconductor package 2003, a package substrate 2100 may be a printed circuit board (PCB). The package substrate 2100 may include a package substrate body portion 2120, upper package pads 2130 (see FIG. 15) disposed on an upper surface of the package substrate body portion 2120, lower pads 2125 disposed on a lower surface of the package substrate body portion 2120 or exposed through the lower surface of the package substrate body portion 2120, and internal interconnections 2135 electrically connecting the upper package pads 2130 and the lower pads 2125 to each other inside the package substrate body portion 2120. The upper package pads 2130 may be electrically connected to the connection structures 2400. The lower pads 2125 may be connected to interconnection patterns 2005 of the main substrate 2010 of the data storage system 2000, as illustrated in FIG. 15, through conductive connection portions 2800.

Each of the semiconductor chips 2200 may include a semiconductor substrate 3010, and a first structure 3100 and a second structure 3200 sequentially stacked on the semiconductor substrate 3010. The first structure 3100 may have a peripheral circuit region including peripheral interconnections 3110. The second structure 3200 may include a common source line 3205, a gate stack structure 3210 on the common source line 3205, channel structures 3220 and separation regions 3230 penetrating through the gate stack structure 3210, bitlines 3240 electrically connected to the channel structures 3220, and gate contact plugs 3235 electrically connected to wordlines WL (see FIG. 14) of the gate stack structure 3210. As described above with reference to FIGS. 1 to 12, in each of the semiconductor chips 2200, the contact conductive layer 165 in the separation regions MS may be connected to the substrate 101 in a region overlapping the openings SP of the upper support layer 190.

Each of the semiconductor chips 2200 may include a through-interconnection 3245 electrically connected to peripheral interconnections 3110 of the first structure 3100 and extending inwardly of the second structure 3200. The through-interconnection 3245 may be disposed on an external side of the gate stack structure 3210, and may be further disposed to penetrate through the gate stack structure 3210. Each of the semiconductor chips 2200 may further include an input/output (I/O) pad 2210 (see FIG. 15) electrically connected to the peripheral interconnections 3110 of the first structure 3100.

By way of summation and review, example embodiments provide a semiconductor device having improved integration density and reliability. Example embodiments also provide a data storage system including a semiconductor device having improved integration density and reliability.

That is, as described above, a semiconductor device may have a structure in which a contact conductive layer, e.g., functioning as a common source line (CSL) contact layer, is formed in a separation region and is, e.g., directly, connected to a substrate below an upper support layer using a process of forming the upper support layer. Accordingly, a semiconductor device having improved integration density and reliability and a data storage system including the same may be provided.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor memory device, comprising:
- a substrate;
- gate electrodes stacked on the substrate, the gate electrodes being spaced apart from each other in a first direction perpendicular to an upper surface of the substrate;
- channel structures penetrating through the gate electrodes, the channel structures extending in the first direction and including channel layers, respectively;
- a horizontal conductive layer below the gate electrodes on the substrate, the horizontal conductive layer being in contact with the channel layers of the channel structures;
- separation regions penetrating through the gate electrodes and the horizontal conductive layer, the separation regions extending in the first direction and in a second direction perpendicular to the first direction, and the separation regions being spaced apart from each other in a third direction perpendicular to the first direction and the second direction;
- a cell region insulating layer covering the gate electrodes and the channel structures;
- an upper support layer on the separation regions and on the cell region insulating layer, the upper support layer having openings that overlap portions of the separation regions; and
- conductive pad layers in the openings, respectively,
- wherein each of the separation regions
  - includes a contact conductive layer and a first separation insulating layer in a trench, and each of the separation regions has first regions below the openings and second regions alternating with the first regions,
- wherein the contact conductive layer is in contact with the substrate in the first regions, and is spaced apart from the substrate by the first separation insulating layer in the second regions,
- wherein each of the separation regions has a bent portion having a width in the third direction, wherein the width of the bent portion changes along the first direction below a corresponding one of the openings,
- wherein the bent portion is positioned at a higher vertical level than a vertical level of an uppermost gate electrode of the gate electrodes stacked on the substrate,
- wherein the conductive pad layers are connected to the contact conductive layer, and
- wherein for each of the separation regions, the bent portion and the uppermost gate electrode are separated by a gap.

2. The semiconductor memory device as claimed in claim 1, wherein:
- each of the separation regions has a first width in the third direction, and
- each of the openings has a second width in the third direction, the second width being greater than the first width.

3. The semiconductor memory device as claimed in claim 1, wherein the conductive pad layers are offset from each other in a zigzag pattern on the separation regions, in a plan view.

4. The semiconductor memory device as claimed in claim 1, wherein the contact conductive layer and the first separation insulating layer extend inwardly in the openings in the first regions.

5. The semiconductor memory device as claimed in claim 1, wherein the first separation insulating layer extends to cover internal side surfaces of the trench and to expose the substrate on a bottom surface of the trench in each of the first regions, the first separation insulating layer covering the internal side surfaces and the bottom surface of the trench in the second regions.

6. The semiconductor memory device as claimed in claim 5, wherein the contact conductive layer extends along the internal side surfaces and the bottom surface of the trench on the first separation insulating layer.

7. The semiconductor memory device as claimed in claim 1,
- wherein each of the separation regions further includes a second separation insulating layer on the contact conductive layer.

8. The semiconductor memory device as claimed in claim 7, wherein the second separation insulating layer has an air-gap therein.

9. The semiconductor memory device as claimed in claim 1, wherein the contact conductive layer fills the trench.

10. The semiconductor memory device as claimed in claim 1, wherein a ratio of a first length of each of the first regions to a second length of each of the second regions in the second direction is within a range of about 0.8 to about 5.0.

11. The semiconductor memory device as claimed in claim 1, further comprising circuit elements below the substrate and electrically connected to the gate electrodes and the channel structures.

12. The semiconductor memory device as claimed in claim 1,
- wherein the separation regions include a first separation region formed below first openings of the openings, and
- wherein, with respect to a first vertical cross section taken parallel to the second direction and through the first separation region:
  - below a first vertical level that is adjacent to the substrate, the contact conductive layer continuously extends in the second direction through the first regions and the second regions,
  - above a second vertical level that is adjacent to the upper support layer, the contact conductive layer comprises discrete U-shaped portions that are separated from one another, each U-shaped portion having a corresponding first portion of the upper support layer formed therein.

13. The semiconductor memory device as claimed in claim 1, wherein, with respect to a top down view, each of the conductive pad layers has first sides opposite to each other in the second direction and second sides opposite to each other in the third direction and the contact conductive layer contacts the first sides and the second sides of each of the conductive pad layers.

14. The semiconductor memory device as claimed in claim 1, wherein the openings have widths in the third direction that are greater than the widths of the separation regions in the third direction.

15. The semiconductor memory device as claimed in claim 1, wherein the separation regions include a first separation region formed below first openings of the openings, and wherein, with respect to a plan view:

the first openings have first sides that are opposite to each other in the third direction, the first separation region has first sides that linearly extend in the second direction and are opposite to each other in the third direction, and the first sides of the first separation region are positioned inside the first sides of the first openings.

16. A semiconductor memory device, comprising:

a substrate;

gate electrodes stacked on the substrate, the gate electrodes being spaced apart from each other in a first direction perpendicular to an upper surface of the substrate;

channel structures penetrating through the gate electrodes, the channel structures extending in the first direction and including channel layers, respectively;

separation regions penetrating through the gate electrodes between the channel structures, the separation regions extending in the first direction and in a second direction perpendicular to the first direction, and each of the separation regions including a contact conductive layer and a separation insulating layer; and pad layers on the channel structures, respectively, and having upper surfaces at a higher level than upper surfaces of the channel structures, each of the pad layers being connected to an upper end of the contact conductive layer, wherein each of the separation regions has first regions and second regions alternately arranged in the second direction, wherein the contact conductive layer is in contact with the substrate in the first regions, and is spaced apart from the substrate by the separation insulating layer in the second regions, wherein each of the separation regions has a bent portion having a width in a third direction perpendicular to the first direction and the second direction, wherein the width of the bent portion changes along the first direction below a corresponding one of the pad layers, wherein the bent portion is positioned at a higher vertical level than a vertical level of an uppermost gate electrode of the gate electrodes stacked on the substrate, and wherein for each of the separation regions, the bent portion and the uppermost gate electrode are separated by a gap.

17. The semiconductor memory device as claimed in claim 16, wherein the pad layers extend along the separation regions in the second direction.

18. The semiconductor memory device as claimed in claim 16, wherein the pad layers and the contact conductive layer each extend at a respective substantially constant width along the second direction.

19. The semiconductor memory device as claimed in claim 16, wherein the pad layers are above the first regions and overlap the first regions.

20. The semiconductor memory device as claimed in claim 19, further comprising an upper support layer surrounding the pad layers on the separation regions and the gate electrodes.

* * * * *